United States Patent
Feinberg et al.

(10) Patent No.: US 11,459,668 B2
(45) Date of Patent: Oct. 4, 2022

(54) TITANIUM PART HAVING AN ANODIZED LAYER

(71) Applicant: Apple Inc., Cupertino, CA (US)

(72) Inventors: Zechariah D. Feinberg, San Francisco, CA (US); James A. Curran, Sunnyvale, CA (US); Todd S. Mintz, San Jose, CA (US); Justin Memar-Makhsous, Toronto (CA)

(73) Assignee: APPLE, INC., Cupertino, CA (US)

( * ) Notice: Subject to any disclaimer, the term of this patent is extended or adjusted under 35 U.S.C. 154(b) by 0 days.

(21) Appl. No.: 16/952,206

(22) Filed: Nov. 19, 2020

(65) Prior Publication Data

US 2021/0348294 A1 Nov. 11, 2021

Related U.S. Application Data

(60) Provisional application No. 63/020,953, filed on May 6, 2020.

(51) Int. Cl.
*G06F 1/16* (2006.01)
*H05K 5/04* (2006.01)
*C25D 11/26* (2006.01)

(52) U.S. Cl.
CPC ............ *C25D 11/26* (2013.01); *G06F 1/1626* (2013.01); *H05K 5/04* (2013.01)

(58) Field of Classification Search
CPC ....... G06F 1/1626; G06F 1/16; C25D 11/022; C25D 11/26; H05K 5/04
USPC ....................................................... 428/469
See application file for complete search history.

(56) References Cited

U.S. PATENT DOCUMENTS

| | | |
|---|---|---|
| 4,344,996 A | 8/1982 | Banks et al. |
| 8,846,551 B2 | 9/2014 | Gupta et al. |
| 2008/0233456 A1 | 9/2008 | Ishikawa et al. |
| 2010/0272963 A1 | 10/2010 | Li et al. |
| 2011/0056836 A1 | 3/2011 | Tatebe et al. |
| 2012/0002282 A1 | 1/2012 | Nagahama et al. |
| 2012/0251779 A1 | 10/2012 | Liu et al. |
| 2013/0043135 A1 | 2/2013 | Demers et al. |

(Continued)

FOREIGN PATENT DOCUMENTS

| | | |
|---|---|---|
| CN | 101088030 B | 11/2013 |
| CN | 103732804 A | 4/2014 |

(Continued)

OTHER PUBLICATIONS

Sappi Fine Paper North America, "Defining and Communicating Color: The CIELAB System", 2013, URL: <https://cdn-s3.sappi.com/s3fs-public/sappietc/Defining%20and%20Communicating%20Color.pdf>, pp. 1-8 (Year: 2013).*

*Primary Examiner* — Humera N. Sheikh
*Assistant Examiner* — Katherine A Christy
(74) *Attorney, Agent, or Firm* — Dorsey & Whitney LLP

(57) ABSTRACT

An enclosure for a portable electronic device can include a titanium substrate defining a textured surface and a nominal surface. The titanium substrate can include a first region that extends above the nominal surface and a second region adjacent to the first region and extending below the nominal surface. A separation distance between an apex of the first region and a bottom of a trough defined by the second region can be at least 1 micrometer. A metal oxide layer can overlay the trough defined by the second region.

7 Claims, 16 Drawing Sheets

(56) References Cited

U.S. PATENT DOCUMENTS

| | | |
|---|---|---|
| 2015/0291827 A1 | 10/2015 | Lee et al. |
| 2016/0105206 A1 | 4/2016 | Zhang et al. |
| 2016/0230302 A1 | 8/2016 | Kang et al. |
| 2017/0336535 A1 | 11/2017 | Shima et al. |
| 2017/0347476 A1 | 11/2017 | Hwang et al. |
| 2018/0084658 A1* | 3/2018 | Poole .................. C23C 14/5886 |
| 2018/0263130 A1 | 9/2018 | Curran et al. |

FOREIGN PATENT DOCUMENTS

| | | | |
|---|---|---|---|
| CN | 105051131 | A | 11/2015 |
| CN | 105506704 | A | 4/2016 |
| CN | 107379586 | A | 11/2017 |
| CN | 108570676 | A | 9/2018 |
| JP | 2011021234 | A | 2/2011 |
| TW | 200822983 | A | 6/2008 |

\* cited by examiner

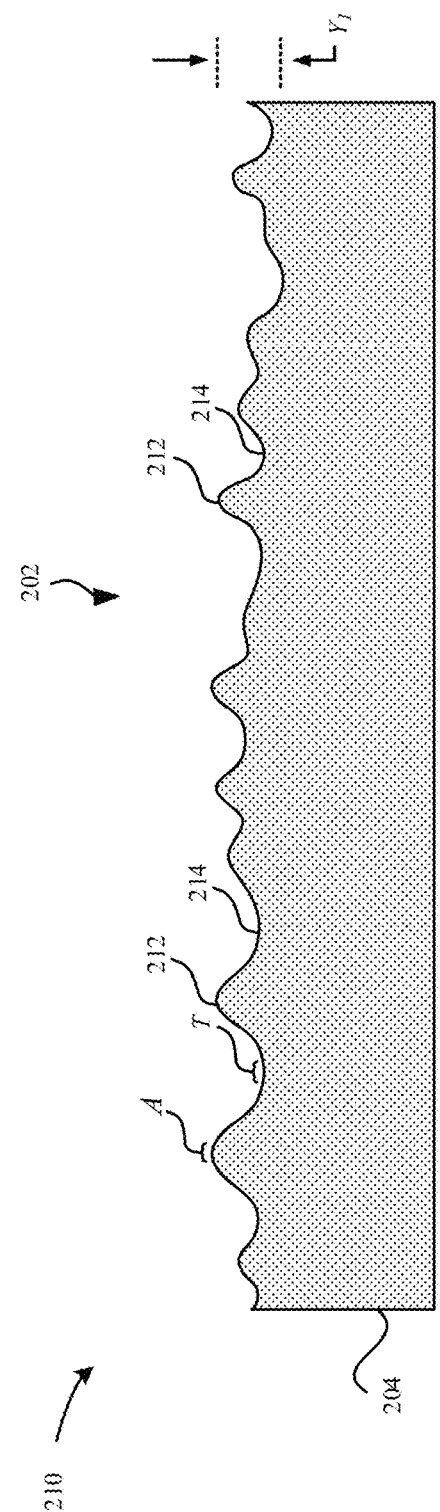

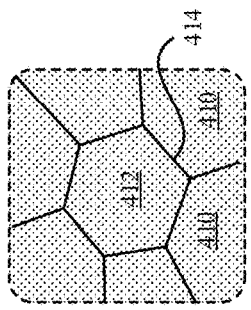
FIG. 4C
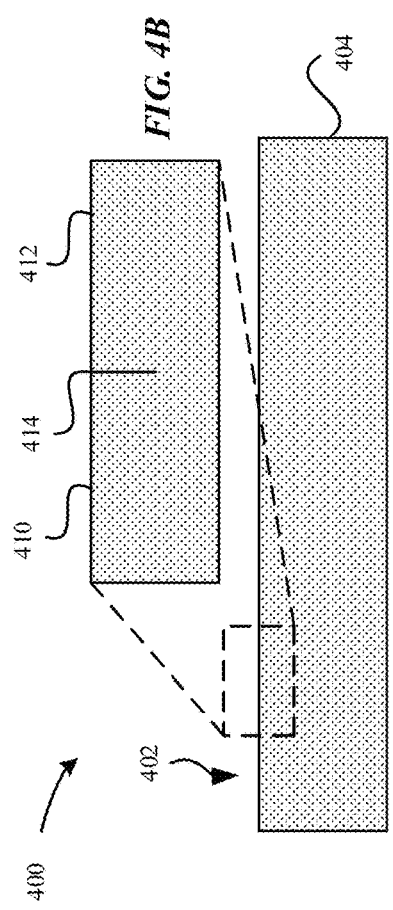
FIG. 4B
FIG. 4A
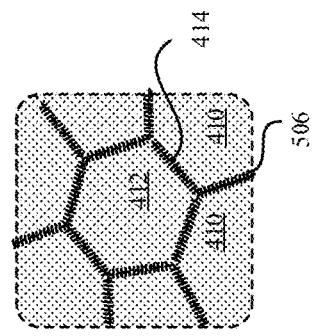
FIG. 5C
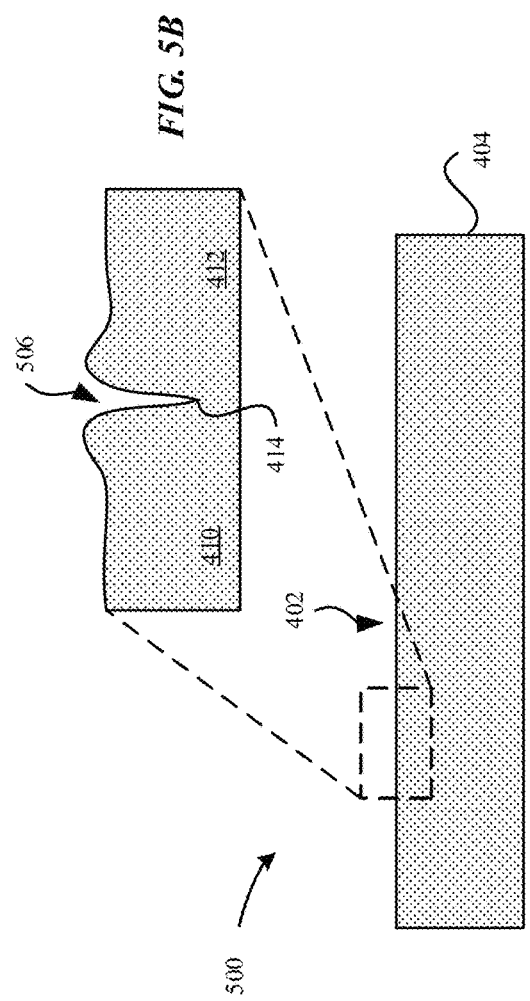
FIG. 5B
FIG. 5A

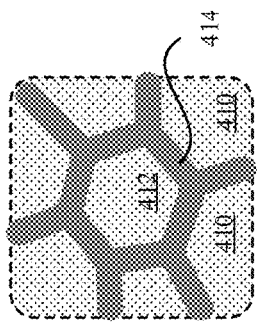
FIG. 6C
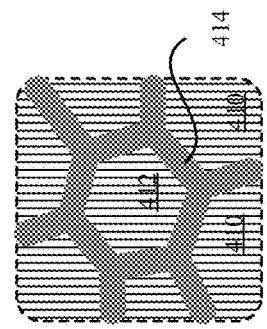
FIG. 7C
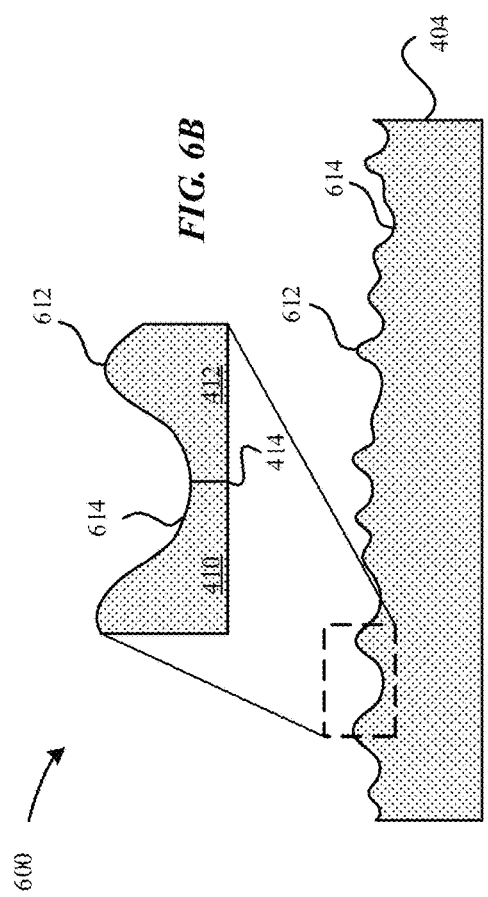
FIG. 6B
FIG. 6A
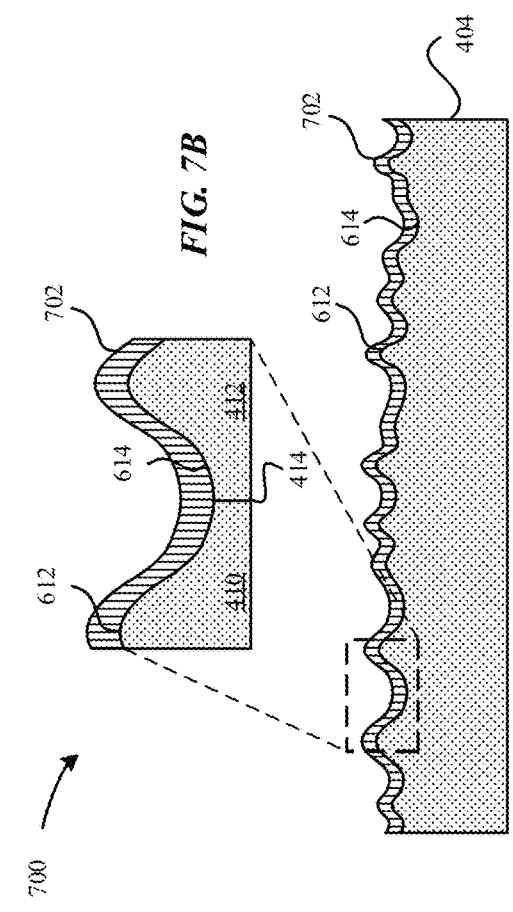
FIG. 7B
FIG. 7A

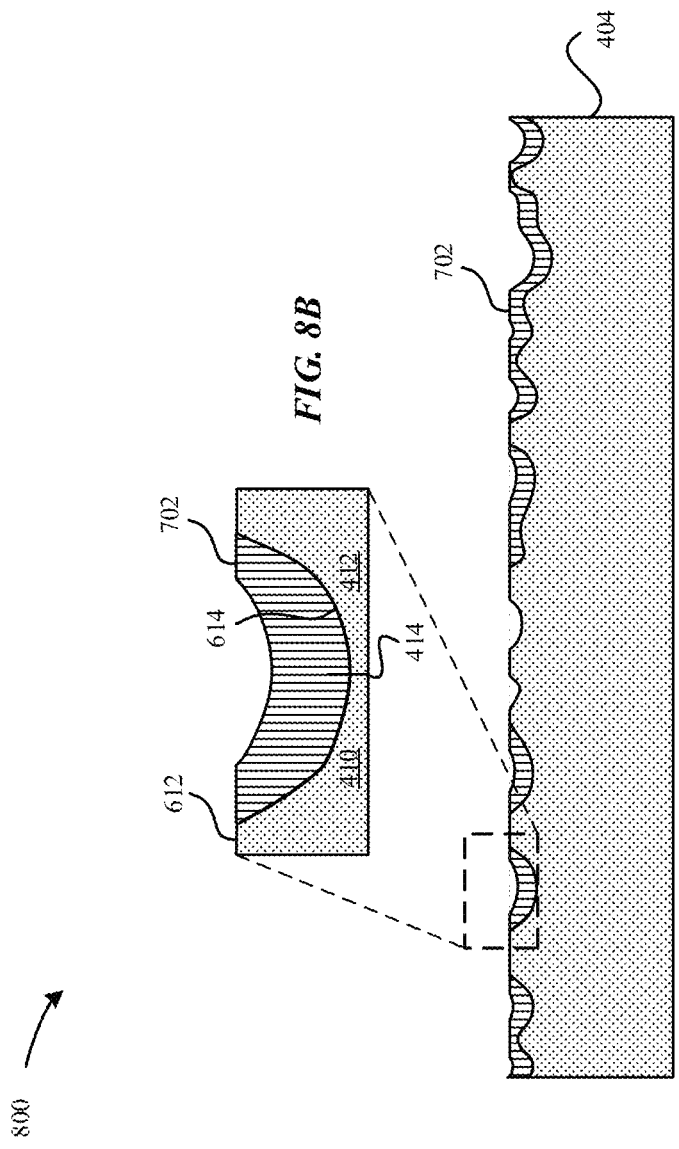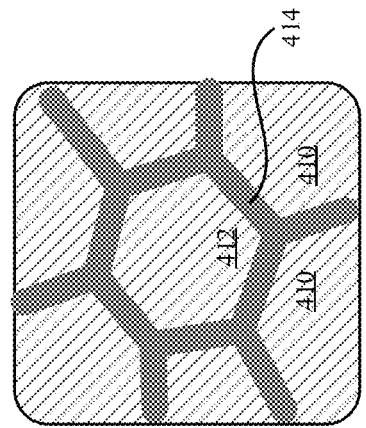
FIG. 8C
FIG. 8B
FIG. 8A

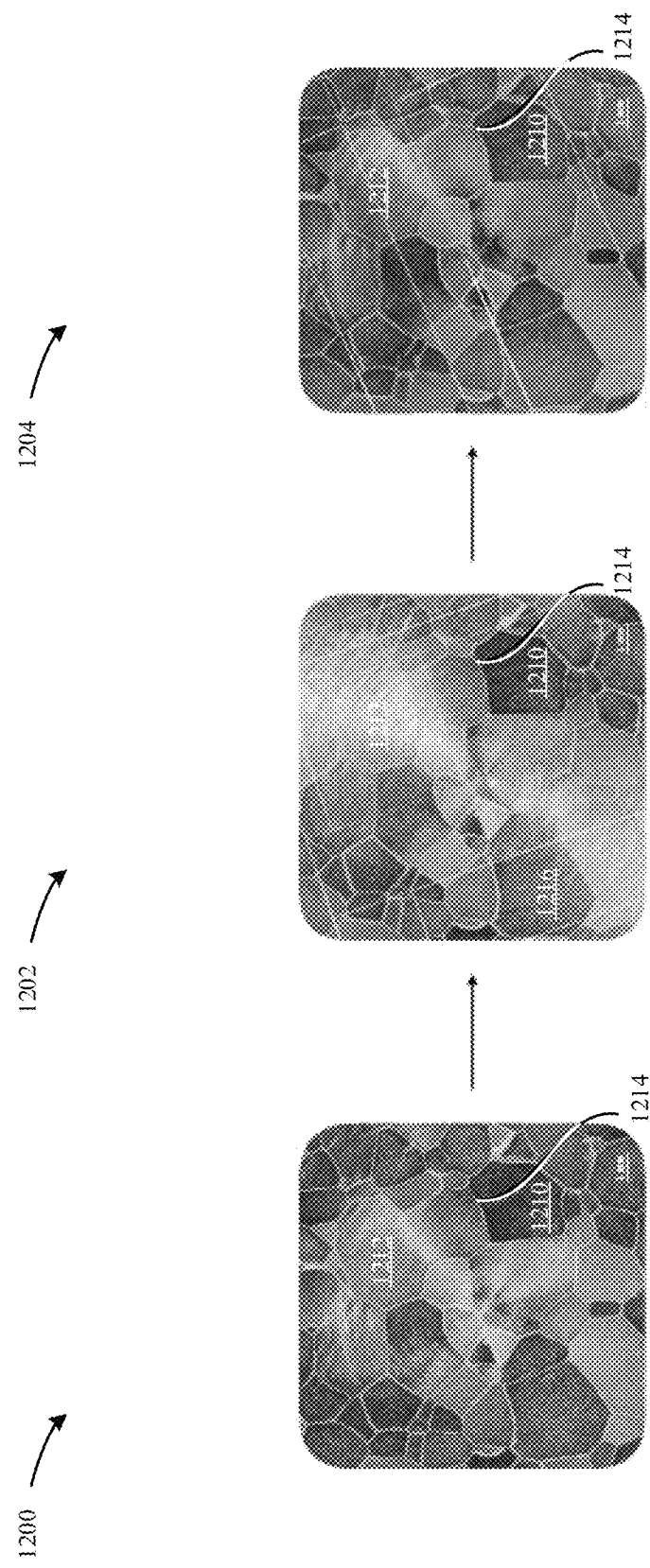

TITANIUM PART HAVING AN ANODIZED LAYER

CROSS-REFERENCE TO RELATED APPLICATIONS

The present application claims priority to U.S. Provisional Application No. 63/020,953, filed 6 May 2020, entitled "TITANIUM PART HAVING AN ANODIZED LAYER", and is related to U.S. application Ser. No. 16/584,692, filed 26 Sep. 2019, entitled "TITANIUM PARTS HAVING A BLASTED SURFACE TEXTURE," the contents of which are incorporated herein by reference in their entireties for all purposes.

FIELD

The described embodiments relate generally to techniques for forming a titanium part. More particularly, the described embodiments relate to systems and methods for forming an anodized layer within a textured surface of the titanium part.

BACKGROUND

Portable electronic devices can include various operational components (e.g., display, processor, antenna, etc.). Enclosures for these portable electronic devices can be formed of various metals (e.g., anodized aluminum, etc.) having a high amount of strength and stiffness to protect these operational components. Additionally, it is preferable to process these enclosures such as to impart these enclosures with an attractive surface finish. However, certain metals, although having a high amount of strength and stiffness, are also difficult to process to impart an attractive surface finish. Accordingly, there is a need to implement techniques for processing these specific types of metals.

SUMMARY

According to some aspects of the present disclosure, an enclosure for a portable electronic device can include a titanium substrate defining a textured surface and a nominal surface, the titanium substrate including a first region that extends above the nominal surface, a second region adjacent to the first region and extending below the nominal surface, a separation distance between an apex of the first region and a bottom of a trough defined by the second region being at least 1 micrometer, and a metal oxide layer overlaying the trough defined by the second region.

In some examples, the enclosure has a color having an a* value between −10 to 15 and a b* value between −35 to 30 in a CIE L*a*b* color space. The color is dependent upon a thickness of the metal oxide layer. The metal oxide layer has a thickness between 20 nanometers to 200 nanometers. The metal oxide layer can include an anodized layer formed from the titanium substrate. The metal oxide layer can include a first metal oxide layer having a first thickness that overlays the apex of the first region and a second metal oxide layer overlaying the trough defined by the second region, the second metal oxide layer can have a second thickness different than the first thickness. The titanium substrate can include a first grain structure and a second grain structure, and the second region corresponds to a grain boundary that separates the first grain structure from the second grain structures. The first grain structure is oriented in a first orientation and the second grain structure is oriented in a second orientation different from the first orientation.

According to some aspects, a portable electronic device can include a titanium substrate defining a textured surface having an average thickness value, the titanium substrate including a first region having a first thickness value less than the average thickness value, a second region adjacent to the first region and having a second thickness value greater than the average thickness value, and an anodized layer overlaying the first region, the anodized layer having a color having a* value between −10 to 15 and a b* value between −35 to 30 in a CIE L*a*b* color space.

In some examples, the color is a first color and the second region includes a second color different from the first color. The second color can be at least partially determined by the second thickness value. The first region defines a trough and a bottom of the trough is separated from an apex of the second region by a separation distance of at least 1 micrometer. The second region defines a planar external surface. The titanium substrate includes a first grain structure and a second grain structure, the first region corresponds to a grain boundary that separates the first grain structure from the second grain structure. The first grain structure can be oriented in a first orientation, and the second grain structure can be oriented in a second orientation different from the first orientation.

According to some aspects, an enclosure for a portable electronic device can include a titanium alloy substrate defining a textured surface and a nominal surface, the titanium alloy substrate including first surface regions extending above the nominal surface and second surface regions extending below the nominal surface, a first anodized layer overlaying the first surface regions, and a second anodized layer overlaying the second surface regions.

In some examples, the first anodized layer has a first average thickness, and the second anodized layer has a second average thickness different from the first average thickness. The first anodized layer has a first color proportional to the first average thickness and the second anodized layer has a second color proportional to the second average thickness. The surface coating has a surface color having an a* value between −10 to 15 and a b* value between −35 to 30 in a CIE L*a*b* color space. The surface color is at least partially determined by the first color and the second color.

BRIEF DESCRIPTION OF THE DRAWINGS

The disclosure will be readily understood by the following detailed description in conjunction with the accompanying drawings, wherein like reference numerals designate like structural elements.

FIGS. 2A-2F illustrate cross-sectional views of various stages of processes for treating a surface of a metal part.

FIGS. 4A-4C illustrate an exemplary cross-sectional view and an exemplary top view of a metal part, in accordance with some embodiments.

FIGS. 5A-5C illustrate exemplary cross-sectional views and an exemplary top view of a metal part, in accordance with some embodiments.

FIGS. 6A-6C illustrate exemplary cross-sectional views and an exemplary top view of a metal part, in accordance with some embodiments.

FIGS. 7A-7C illustrate exemplary cross-sectional views and an exemplary top view of a metal part, in accordance with some embodiments.

FIGS. 8A-8C illustrate exemplary cross-sectional views and an exemplary top view of a metal part, in accordance with some embodiments.

FIGS. 12A-12C illustrate exemplary optical microscope images of a top view of a metal part having grain structures, in accordance with some embodiments.

Figure 1:
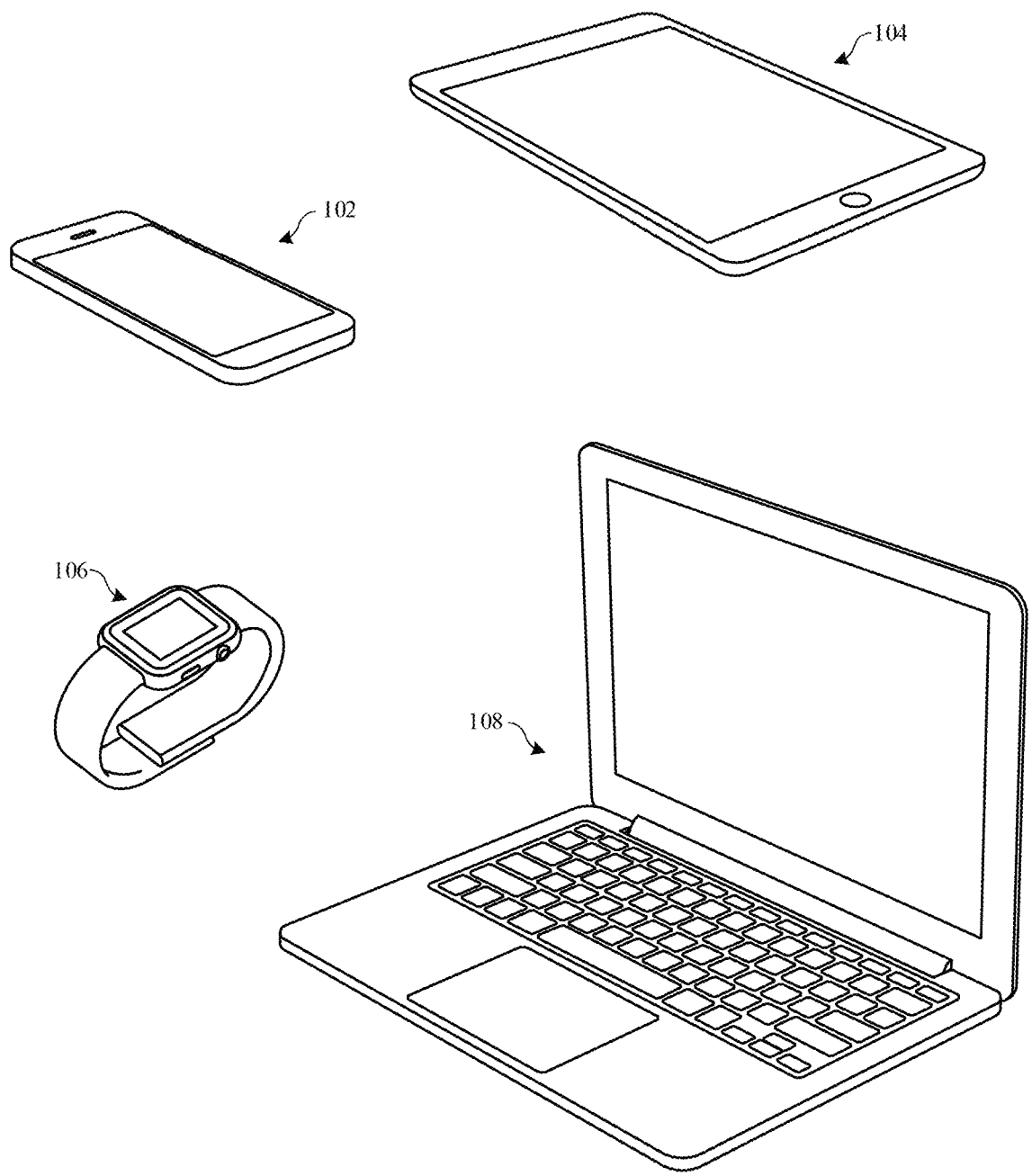
FIG. 1 illustrates perspective views of various devices having surfaces that can be processed using the techniques described herein.

Those skilled in the art will appreciate and understand that, according to common practice, various features of the drawings discussed below are not necessarily drawn to scale, and that dimensions of various features and elements of the drawings can be expanded or reduced to more clearly illustrate the embodiments of the present invention described herein.

DETAILED DESCRIPTION

Representative applications of methods and apparatus according to the present application are described in this section. These examples are being provided solely to add context and aid in the understanding of the described embodiments. It will thus be apparent to one skilled in the art that the described embodiments can be practiced without some or all of these specific details. In other instances, well known process steps have not been described in detail in order to avoid unnecessarily obscuring the described embodiments. Other applications are possible, such that the following examples should not be taken as limiting.

In the following detailed description, references are made to the accompanying drawings, which form a part of the description and in which are shown, by way of illustration, specific embodiments in accordance with the described embodiments. Although these embodiments are described in sufficient detail to enable one skilled in the art to practice the described embodiments, it is understood that these examples are not limiting; such that other embodiments can be used, and changes can be made without departing from the spirit and scope of the described embodiments.

Portable electronic devices can include various operational components (e.g., display, processor, antenna, etc.). Enclosures of these portable electronic devices are capable of protecting these operational components from physical damage, such as during a drop event. The enclosures can be formed of various metals, such as titanium or a titanium alloy. Additionally, titanium alloys can be colored using an anodization process in order to impart the titanium alloys with a color through interference coloring. In particular, the interference color imparts the titanium alloys with a color that is distinct from the natural color of titanium and dependent upon a thickness of the anodized layer.

Although the anodized layer can impart the titanium alloy with a different color, the surface of the anodized layer is particularly vulnerable to abrasion and mechanical stresses. The abrasion and mechanical stresses can wear against the surface of the anodized layer; thereby, prematurely removing the color of the anodized layer.

According to some embodiments, the durability of the color of the anodized layer can be improved by forming the anodized layer only within grooves or valleys of the external surface of the titanium alloy. In particular, the anodized layer can be recessed relative to the external surface of the titanium alloy. Beneficially, the anodized layer is generally protected from the same abrasion forces that the external surface is exposed to.

The embodiments described herein set forth techniques for texturizing the surface of a titanium alloy by exposing the titanium alloy to a selective etching process in order to selectively form microstructural peaks and valleys along the external surface of the titanium alloy. Thereafter, an anodized layer is formed to overlay the external surface of the titanium alloy. Subsequently, portions of the anodized layer are removed from the peaks by using a mechanical finishing process (e.g., blasting, etc.). As a result, the anodized layer generally overlays more of the valleys than the peaks so that the anodized layer is generally protected from abrasion forces. Beneficially, the durability of the color of the anodized layer is improved.

In some examples, the color of the anodized layer can be characterized according to CIE L*a*b* color-opponent dimension values. The L* color opponent dimension value is one variable in an L*a*b* color space. In general, corresponds to an amount of lightness. L*=0 represents an extreme black while L*=100 represents white. In general, a* indicates amounts of red color and green color in a sample. A negative a* value indicates a green color, while a positive a* value indicates a red color. Accordingly, samples having a positive a* value will indicate that more red than green is present. In general, b* indicates amounts of blue color and yellow color in a sample. A negative b* value indicates a blue color, while a positive b* value indicates yellow color. Accordingly, samples having a positive b* value will indicate more yellow than blue is present.

According to some embodiments, an enclosure for a portable electronic device is described. The enclosure includes a surface coating having a titanium substrate having a textured surface including a nominal surface, the textured surface including (i) a first region that extends above the nominal surface, and (ii) a second region adjacent to the first vertical region and extending below the nominal surface, where a separation distance between an apex of the first region and a trough of the second region is at least 1 micrometer. The surface coating further includes a metal oxide layer overlaying the trough of the second region.

These and other embodiments are discussed below with reference to FIGS. 1-14. However, those skilled in the art will readily appreciate that the detailed description given herein with respect to these figures is for explanatory purposes only and should not be construed as limiting.

FIG. 1 illustrates various portable devices that can be processed using the techniques as described herein. The techniques as described herein can be used to process metallic surfaces (e.g., titanium substrate, titanium alloy substrate, etc.) of enclosures of portable electronic devices. FIG. 1 illustrates a smartphone 102, a tablet computer 104, a smartwatch 106, and a portable computer 108. According to some embodiments, the metallic surfaces can refer to a metal substrate that is capable of being anodized. In some examples, the metal substrate can include a titanium alloy substrate. Notably, the titanium alloy substrate can include a titanium alloy having different grain structures of alpha and beta metallic phases.

Titanium and its alloys are characterized as having a high specific strength and stiffness, which makes titanium an attractive choice for the enclosures of the exemplary portable electronic devices described herein. For example, titanium alloys, such as Ti-6Al-4V can have a Vickers hardness number of from about 300 Hv to about 350 Hv. Additionally, certain alloying elements can be incorporated into the titanium to further increase the hardness. Thus, titanium alloy components, such as enclosures, can protect internal operational components carried by the enclosures, for example, when these portable electronic devices are dropped, scratched, chipped, or abraded. Accordingly, described herein are several examples for texturizing an external surface of the titanium alloy substrate.

Figure 2C:
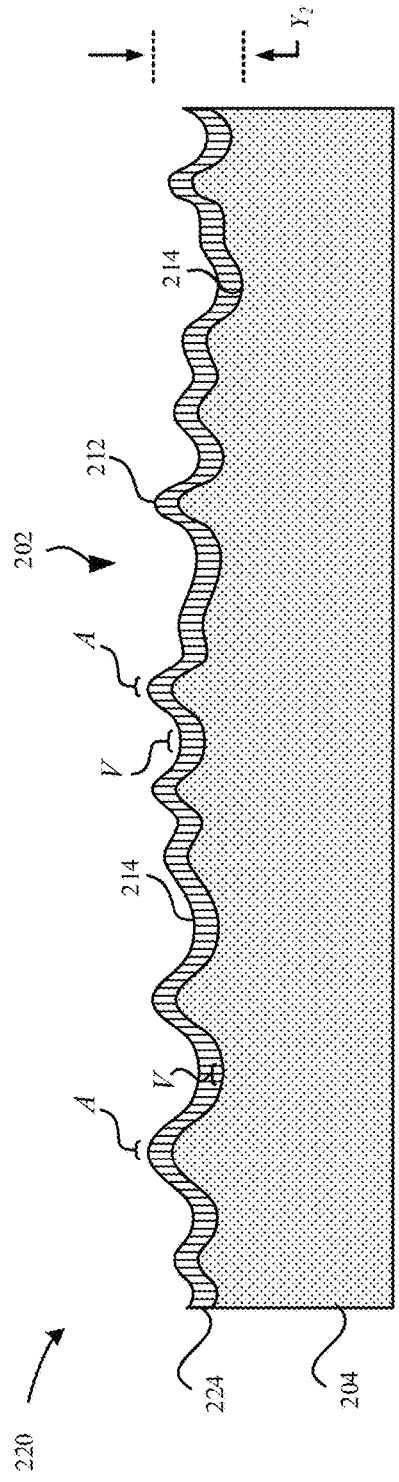

FIGS. 2A-2F illustrate cross-sectional views of various stages of process for treating a surface of a metal part as described herein, for example, to form an anodized coating. FIG. 2A illustrates a metal part 200 prior to undergoing a texturizing process. In some examples, the metal part 200 includes a metal substrate 204 that is capable of being anodized. The metal substrate 204 includes a titanium alloy having a single grain structure (alpha phase) or multi-phase structure (alpha and beta phases).

In some embodiments, the metal substrate 204 has a thickness that is suitable for undergoing an etching process. Indeed, the etching process can remove an amount of material from an upper region of the metal substrate 204 (i.e., at least 1 micrometer from the external surface). In some embodiments, the metal part 200 has a near net shape of a final part, such as the enclosures of the portable electronic devices 102, 104, 106, and 108. In some examples, the external surface 202 of the metal part 200 is characterized as having a planar shape or a generally planar shape, as illustrated in FIG. 2A. In some examples, the metal part 200 is characterized as having a uniform thickness or generally uniform thickness.

According to some embodiments, prior to the surface texturizing process, the metal substrate 204 can be subjected to a machining process in order to impart the metal substrate 204 with a final shape. Thereafter, the metal substrate 204 can be wet-sanded to remove any machining marks in order to impart the external surface 202 with a fine, uniform, smooth finish. Thereafter, the external surface defined by the metal substrate 204 can be optionally polished to achieve a uniform high gloss finish.

FIG. 2B illustrates a textured metal part 210 subsequent to undergoing a texturizing process in order to roughen and/or texturize the external surface 202 of the metal substrate 204, in accordance with some embodiments. According to some examples, the external surface 202 can be texturized by exposing the external surface 202 to a mechanical brushing process. For example, the external surface 202 is brushed by exposure to a brushing media (e.g., grinding wheel). Indeed, the process for forming a metal part having an anodized coating as described with reference to FIGS. 2A-2F is performed with respect to a mechanical brushing process. However, the metal substrate 204 can also be texturized using a chemical etching process, as will be described in greater detail with reference to FIGS. 6A-6C.

As a result of the texturizing process, the external surface 202 of the textured metal part 210 has a surface roughness defined as an average amplitude of vertical deviations (positive and negative deviations) from a nominal surface of the textured metal part 210 over a specified length surface. More specifically, the vertical deviations from the nominal surface can include positive vertical deviations in the form of peaks 212 that alternate with negative vertical deviations in the form of valleys 214 (also referred to as troughs). In some examples, the alternating positive and negative vertical deviations from the nominal surface can be randomly distributed or evenly distributed from each other. In some examples, the nominal surface can be an imaginary planar surface that has a single height or position equivalent to the average height or position of the textured surface. Beneficially, using the mechanical brushing process, the fraction of the external surface 202 including peaks and valleys is more repeatable and can be more precisely controlled relative to a chemical etching process.

According to some examples, an apex (A) of the peak 212 is separated from a bottom (T) of the valley 214 by a separation distance ($Y_1$) of at least 1 micrometer or greater. In some examples, the separation distance ($Y_1$) is between 1 micrometer to 10 micrometers. As understood by those of ordinary skill in the art, the separation distance between the apex (A) of the peak 212 and the bottom (T) of the valley 214 is preferably at least 1 micrometer or greater in order to accommodate for an anodized layer that will be formed to overlay the valley 214. In some examples, the surface roughness of the external surface 202 of the textured metal part 210 is characterized according to the separation distance ($Y_1$) between the apex (A) of the peak 212 and the bottom (T) of the valley 214. As used herein, the apex of a surface can be used to refer to the point or region of a surface that is disposed furthest from a nominal surface in a direction perpendicular to the nominal surface.

As illustrated in FIG. 2B, the alternating peaks 212 and valleys 214 can be randomly distributed from each other. The apex (A) of the peaks 212 and the bottoms (T) of the valleys 214 can have varied depths of at least 1 micrometer to 5 micrometers. In some examples, the mechanical brushing process can roughen the external surface 202 of the metal substrate 204 in a controlled manner to result in fine-scale surface roughness.

According to some embodiments, the textured metal part 210 can also be formed by using a micro-arc oxidation process. Techniques for using micro-arc oxidation to texturize an external surface of a titanium or titanium alloy substrate are described with reference to U.S. application Ser. No. 16/584,692 entitled "TITANIUM PARTS HAVING A BLASTED SURFACE TEXTURE," filed Sep. 26, 2019, the contents of which are incorporated herein by their entirety for all purposes.

FIG. 2C illustrates an anodized metal part 220 subsequent to undergoing an anodization process, in accordance with some embodiments. According to some examples, the textured metal part 210 is exposed to an anodization process that involves exposing the metal substrate 204 to an anodization process (e.g., between 25 volts-35 volts) that causes an anodized layer 224 to form from the metal substrate 204. The anodized layer 224 overlays the entire external surface 202 of the textured metal part 210.

As illustrated in FIG. 2C, the anodized layer 224 overlays the peaks 212 and the valleys 214; thereby, increasing a separation distance between the apex (A) of the peaks and the bottoms (T) of the valleys 214. For example, FIG. 2C illustrates that the separation distance ($Y_2$) between the apex (A) of the peak 212 of the anodized layer 224 and the bottom (T) of the valley 214 of the metal substrate 204 is greater than the separation distance ($Y_1$). According to some examples, the apex (A) of the peaks 212 are rounded caused by preferential anodization of the peaks 212 relative to the valleys 214 during the anodization of the metal substrate 204. The thickness of the anodized layer 224 can vary between 20 nanometers and 200 nanometers.

The anodized layer 224 can impart the anodized metal part 220 with a thin-film interference color. As is understood by those of ordinary skill in the art, different thin-film interference colors are proportional to the thicknesses of the anodized layer 224. The amplitude of the anodizing voltage can affect the thickness of the anodized layer 224.

Figure 2D:
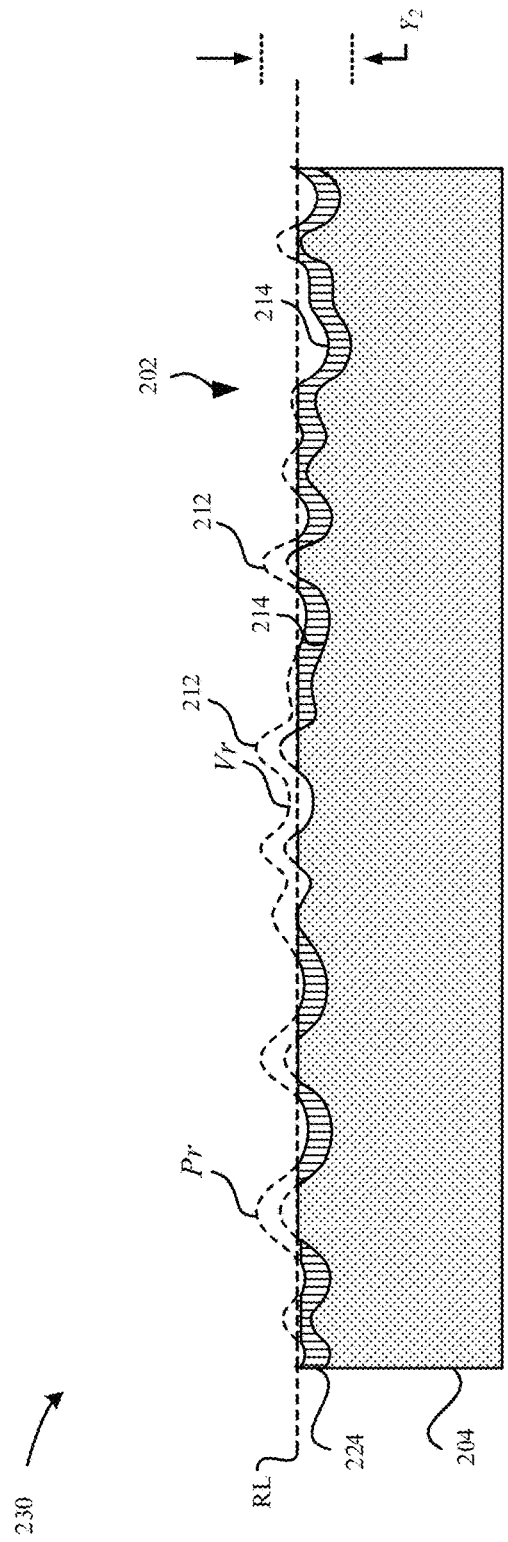

FIG. 2D illustrates a processed anodized part 230 subsequent to the anodized metal part 220 undergoing a mechanical finishing process, in accordance with some embodiments. According to some examples, the mechanical removal process includes at least one of a blasting, buffing or polishing process. According to some embodiments, the external surface 202 of the anodized metal part 220 can be subjected to the mechanical removal process order to preferentially remove more metallic material from the peaks 212 than the valleys 214. For example, FIG. 2D illustrates a material removal line (RL) that denotes different regions of peaks 212 and valleys 214 that are mechanically removed subsequent to the blast mechanical removing process. In some examples, the amount of the regions of the peaks 212 and valleys 214 that is removed according to the removal line (RL) is based on at least one of a duration, intensity, size of blasting particles that are utilized during the blasting process. In some instances, it can be desirable to remove a greater amount of the peaks 212 relative to the valleys 214 in order to achieve a smoother surface having a higher gloss finish. In some examples, the size of the blasting media is greater than the sizes of the peaks 212.

As illustrated in FIG. 2D, regions of the peaks 212 and the valleys 214 are removed subsequent to the blasting process as indicated by the removed peaks ($P_r$) and removed valleys ($V_r$). In other words, the separation distance between apex (A) of the peaks 212 of the anodized layer 224 and the bottoms (T) of the valleys 214 is reduced subsequent to the blasting process. In some embodiments, blasting the external surface 202 can reduce surface asperities, which tends to favor reducing a greater amount of the peaks 212 relative to the valleys 214. As a result, the external surface 202 of the processed anodized part 230 is more attenuated or flatter relative to the external surface 202 of the anodized metal part 220. The portions of the anodized layer 224 that overlay the valleys 214 and are recessed relative to the uppermost portions of the external surface 202 are generally resistant to abrasion. Accordingly, the interference color imparted by these portions of the anodized layer are very durable relative to the uppermost portions of the external surface 202.

Figure 2E:
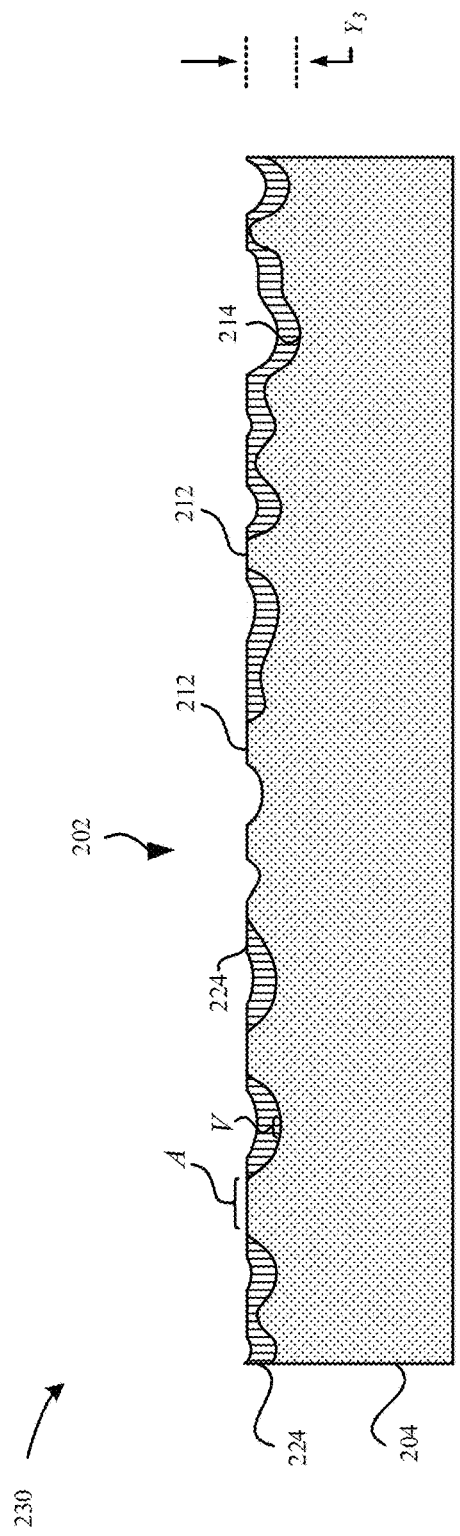

As illustrated in FIG. 2E, the separation distance between the apex (A) of the peaks 212 and the bottom (T) of the valleys 214 is reduced to (Y3) where (Y3)<(Y2). In some examples, the separation distance (Y3) between the apex (A) of the peaks 212 and the bottom (T) of the valleys 214 is at least 1 micrometer or greater. In some examples, the separation distance (Y3) is 2 to 3 micrometers or greater. In some examples, the separation distance (Y3) is no greater than 10 micrometers.

Figure 2F:
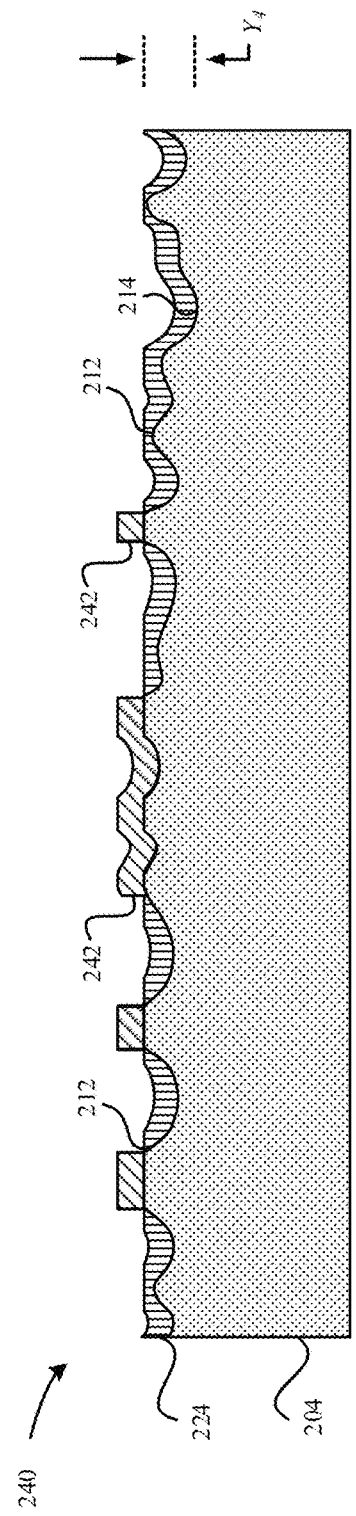

FIG. 2F illustrates an oxidized part 240 subsequent to exposing the processed anodized part 230 to an additional process, in accordance with some embodiments. The processed anodized part 230 can be exposed to the additional process to form multiple colors (i.e. non-natural titanium colors). In particular, the exposed regions of the metal substrate 1102 corresponding to the removed peaks (Pr) and removed valleys (Vr) can be subjected to an additional anodization process to form a metal oxide layer 242. Alternatively, the oxidized part 240 is formed by exposing the processed anodized part 230 to a process that can include a physical vapor deposition process or other deposition process. In some examples, a deposited layer can then be subjected to further processing, for example to form a metal oxide layer 242. The metal oxide layer 242 can overlay more of the peaks 212 than the valley 214 that were exposed as a result of the mechanical finishing process. In particular, the metal oxide layer 242 only overlays those peaks 212 and/or valleys 214 that are exposed (i.e., not overlaid by the anodized layer 224) subsequent to the mechanical finishing process. The metal oxide layer 242 can impart an additional color (e.g., black, gold, etc.) to the oxidized part 240. The metal oxide layer 242 can increase the surface hardness for improved abrasion resistance. In some examples, the metal oxide layer 242 has a thickness between 10 nanometers to 200 nanometers.

In some examples, the metal oxide layer 242 can have a different thickness than the anodized layer 224; thereby, imparting different thin-film interference colors across the surface of the oxidized part 240. In particular, the anodized layer 224 is associated with a first color and the metal oxide layer 242 is associated with a second color different than the first color. The combined color of the oxidized part 240 is based upon the colors of the anodized layer 224 and the metal oxide layer 242, which is dependent upon their respective differences in thickness. Additionally, a person viewing the external surface 202 of the oxidized part 240 from different angles can perceive different colors. The difference in perceived colors is due to the respective angularity or directionality of the peaks 212 and valleys 214. As described herein, the angularity can refer to an orientation of the peaks and valleys 214 with respect to a surface normal of the external surface 202.

Figure 3:
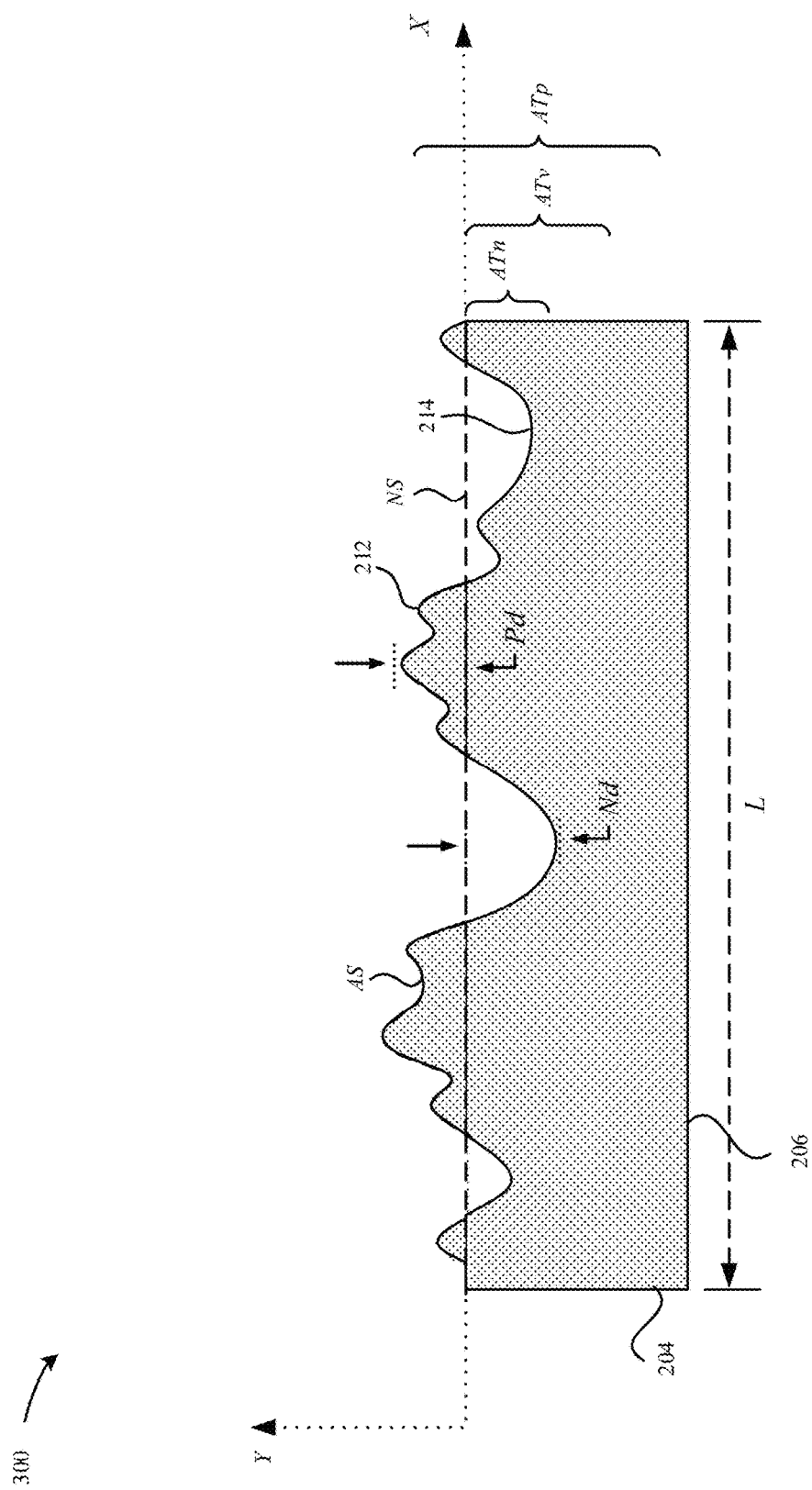
FIG. 3 illustrates an exemplary diagram of a metal part having a textured surface.

FIG. 3 illustrates an exemplary diagram of a metal part 300 having a textured surface, in accordance with some embodiments. According to some examples, the metal part 300 can refer to any one of the textured metal part 210, the anodized metal part 220, the processed anodized part 230 or the oxidized part 240. For simplicity of illustration, individual structural details of the textured metal part 210, the anodized metal part 220, the processed anodized part 230 or the oxidized part 240 are not illustrated with reference to the metal part 300 of FIG. 3, as they were previously described with reference to FIGS. 2A-2F.

The metal part 300 can include peaks 212 and valleys 214 along an actual surface (AS), where the peaks 212 and valleys 214 are defined as positive and negative vertical deviations from a nominal surface (NS), respectively. As shown in FIG. 3, the nominal surface (NS) is represented as a nominal longitudinal line that spans the length (L) of the metal part 300. The actual surface (AS) includes positive deviations (Pd) that extend above the nominal line and negative deviations (Nd) that extend below the nominal line. In some embodiments, the positive deviations (Pd) can be referred to as first vertical region that extends above the nominal surface (NS) and the negative deviations (Nd) can be referred to as a negative vertical region that extends below the nominal surface (NS).

According to some embodiments, the metal part 300 is characterized as having an average thickness value (ATv). The average thickness value can correspond to an average thickness of the metal part 300 that takes into account the amplitudes of the positive and negative deviations (Pd, Nd). Additionally, the positive deviations (Pd) are characterized as having a first average thickness value (ATp) and the negative deviations (Nd) are characterized as having a second average thickness value (ATn). The positive deviations (Pd) take into account an average thickness of all of the peaks of the metal part 300 from the bottom surface 206 of the metal substrate 204 extending to the apex (A) of each peak 212. The negative deviations (Nd) take into account an average thickness of all of the valleys 214 of the metal part 300 from the bottom surface 206 of the metal substrate 204 extending to the bottom (T) of each valley 214. As illustrated in FIG. 3, the first average thickness value (ATp) of the positive deviations (Pd) is greater than the second average thickness value (ATv) of the metal part 300. Additionally, the second average thickness value (ATn) of the negative deviations (Nd) is less than the average thickness value (ATv) of the metal part 300. Although not illustrated in FIG. 3, the positive deviations (Pd) and the negative deviations (Nd) also take into account the thicknesses of the anodized layer 224 and the metal oxide layer 242.

FIGS. 4A-4C illustrate exemplary cross-sectional views and an exemplary top view of a metal part, in accordance with some embodiments. FIG. 4A illustrates a cross-sectional view of a metal part 400. The metal part 400 can include a titanium alloy having different grain structures. For example, these grain structures can be the result of incorporating different alloying elements into the titanium alloy such as molybdenum, silicon, vanadium, and the like. FIG. 4A illustrates that the external surface 402 of the metal part 400 is planar or generally planar.

FIG. 4B illustrates a magnified cross-sectional view of a region of the metal part 400. As shown in FIG. 4B, the metal part 400 includes a first grain structure 410 separated from a second grain structure 412 by a grain boundary 414. The first and second grain structures 410, 412 can have different etching and anodization rates. FIG. 4C illustrates a magnified top view of the region of the metal part 400. As shown in FIG. 4C, the second grain structure 412 is separated from first grain structures 410 by the grain boundary 414. In some examples, the first and second grain structures 410, 412 can be associated with an alpha phase. The alpha phase refers to a hexagonal close-packed crystalline structure.

FIGS. 5A-5C illustrate exemplary cross-sectional views and an exemplary top view of a treated metal part, in accordance with some embodiments. In particular, FIG. 5A illustrates a treated metal part 500. In particular, the metal part 400 is exposed to a treatment process to form the treated metal part 500. In some examples, the treatment process involves exposing the metal part 400 to specific heat temperatures and soak times above a beta phase transus temperature (beta annealing process) for the purposes of controlling the sizes of the grain structures 410, 412. In some examples, the heat treatment involves exposure to a temperature of 700° C. to 1050° C. for a duration of 1 to 2 hours. The beta phase refers to a body-centered cubic structure. Transformation of the alpha phase to the beta phase can occur upon heating the metal part 400.

FIG. 5B illustrates a region of the metal substrate 404 where the sizes of the grain structures 410, 412 can be controlled and adjusted using the treatment process, such as to increase or decrease the sizes of the grain structures 410, 412. In particular, the amount of fraction of the valleys formed within the external surface 402 is dependent upon the sizes of the grain structures 410, 412.

Additionally, the treatment process can include precipitating a secondary phase (e.g., alpha phase) at the grain boundary 414 to form precipitates. As a result, the grain structures 410, 412 are associated with dual phases (alpha, beta). The precipitation step can increase a hardness of the titanium alloy. As a result, the grooves 506 form along the periphery of the grain boundary 414, as illustrated with respect to FIG. 5C. FIG. 5C illustrates a magnified top view of the region of the treated metal part 500.

Beneficially, adjusting the size of the grain structures 410, 412 in conjunction with a chemical etching process enables a much finer level of control and granularity of the aspect ratio of the grain structures 410, 412 not otherwise achievable using the mechanical finishing process (e.g., brushing, etc.). As a result, the sizes of the resulting valleys and peaks of the textured metal part are much more controllable and can lend to forming smaller peaks and valleys than otherwise possible using mechanical finishing processes. However, forming the peaks and valleys using a brushing process lends to more repeatable shapes of peaks and valleys with more of a linear size relative to those peaks and valleys formed through a chemical etching process.

FIGS. 6A-6C illustrate exemplary cross-sectional views and an exemplary top view of a textured part, in accordance with some embodiments. FIG. 6A illustrates a cross-sectional view of a textured part 600. In particular, the treated metal part 500 is exposed to an etching process to form the textured part 600. In some examples, the etching process includes a chemical etching process (e.g., Kroll's etch) to selectively etch the grain boundary 414 of the grain structures having the alpha phase at a different etchant rate than the grain structures having the beta phase. The grain structures having the alpha phase will etch at a greater rate than those grain structures having the beta phase, thereby causing valleys 614 to form in regions of the metal substrate 404 corresponding to the alpha phase. Additionally, the valley 614 can form in a region of the metal substrate 404 corresponding to the grain boundary 414, as illustrated by FIG. 6B. FIG. 6C illustrates a magnified top view of the region of the textured part 600 where the valleys 614 forms over the region corresponding to the grain boundary 414.

FIGS. 7A-7C illustrate exemplary cross-sectional views and an exemplary top view of an anodized part, in accordance with some embodiments. FIG. 7A illustrates a cross-sectional view of an anodized part 700. In particular, the textured part 600 is exposed to an anodizing process to form the anodized part 700. As illustrated in FIG. 7B, the anodized part 700 includes an anodized layer 702 that overlays the peaks 612 and valleys 614 of the metal substrate 404. In some examples, the shape of the anodized layer 702 conforms to a shape of the peaks 612 and valleys 614. For example, FIG. 7B illustrates a region of the anodized part 700 where the shape of the anodized layer 702 corresponds to the shape of the peaks 612 and valleys 614. FIG. 7C illustrates a magnified top view of the region of the anodized part 700.

FIGS. 8A-8C illustrate exemplary cross-sectional views and an exemplary top view of a processed anodized part, in accordance with some embodiments. FIG. 8A illustrates a cross-sectional view of the processed anodized part 800. In particular, the processed anodized part 800 is exposed to a mechanical finishing process, such as a blasting, lapping or polishing process in order to preferentially remove more of portions of the anodized layer 702 overlaying the peaks 612 than the valleys 614. As a result, more of the anodized layer 702 overlays the valleys 614 than the peaks 612.

FIG. 8B illustrates a region of the processed anodized part 800 that illustrates that more of the anodized layer 702 overlays the valleys 614 than the peaks 612. Beneficially, this structure imparts the anodized layer 702 of the processed anodized part 800 with greater durability than traditionally anodized structures because portions of the anodized layer 702 are recessed below the uppermost regions of the peaks 612 and are less susceptible to being scratched or abraded. FIG. 8C illustrates a magnified top view of the region of the processed anodized part 800.

Figure 9:
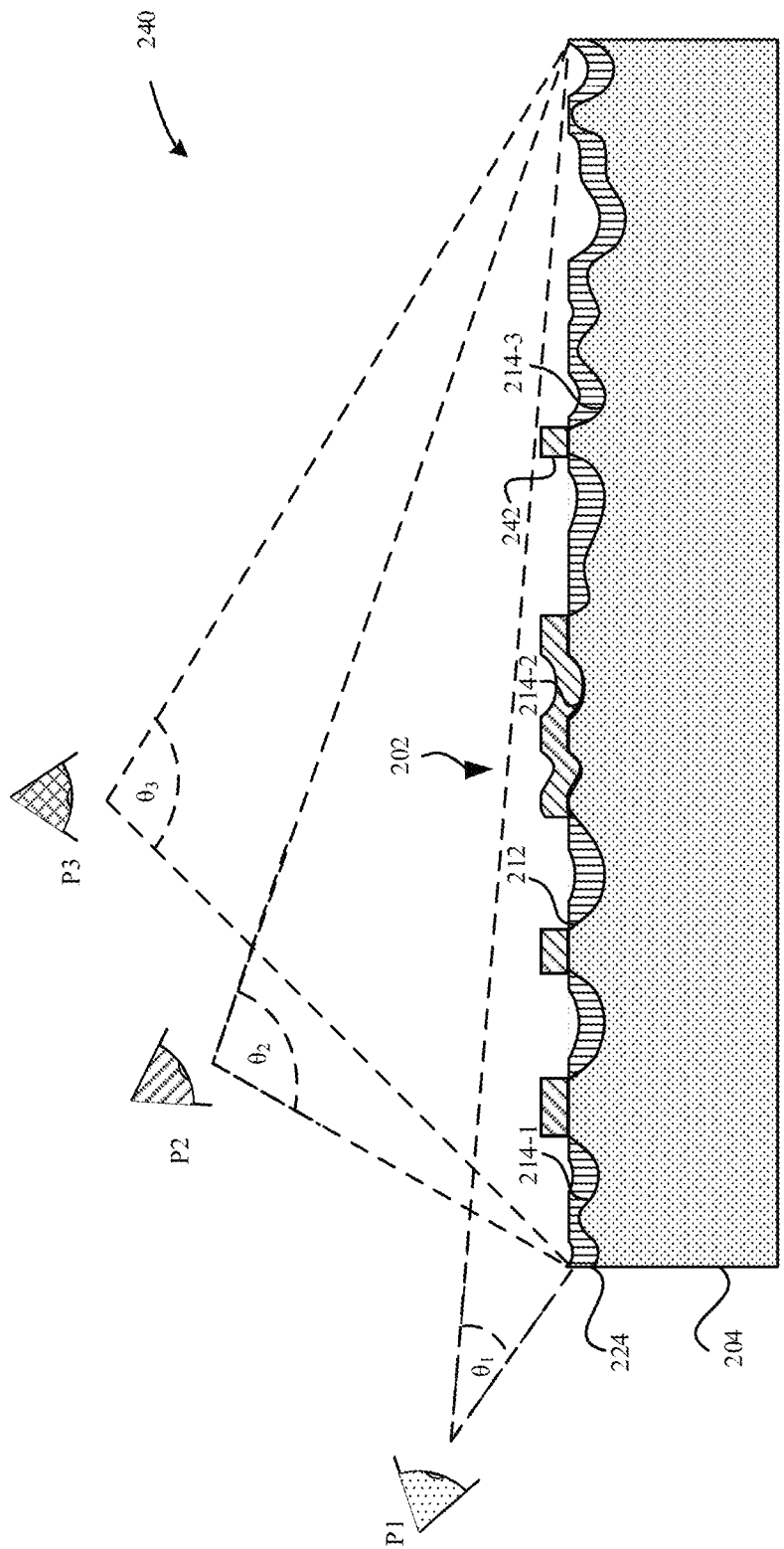
FIG. 9 illustrates an exemplary diagram of a metal part having an anodized coating, in accordance with some embodiments.

FIG. 9 illustrates an exemplary diagram of a metal part having an anodized coating, in accordance with some embodiments. As described herein, the global color of an anodized part having a textured surface can be controlled by adjusting the relative grain sizes and grain structures.

FIG. 9 illustrates an exemplary diagram of the oxidized part 240, as described with reference to FIG. 2F. The oxidized part 240 includes a first valley 214—1, a second valley 214—2, and a third valley 214—3. FIG. 9 illustrates that the oxidized part 240 includes an anodized layer 224 overlays each of the first, second, and third valleys 214—1, 2, 3.

The first, second, third valleys 214—1, 2, 3 of the oxidized part 240 of FIG. 9 can have different angularity or directionality with respect to each other. In other words, the first valley 214—1 can be oriented in a first angle with respect to a surface normal of the external surface 202, the second valley 214—2 can be oriented in a second angle different than the first angle with respect to the surface normal of the external surface 202, and the third valley 214—3 can be oriented in a third angle different than the first and/or second angles with respect to the surface normal of the external surface 202. As a result, the oxidized part 240 can be perceived as a different color depending upon the viewing angle of the oxidized part 240.

FIG. 9 illustrates that an observer can perceive a first color (P1) when viewing the external surface 202 of the oxidized part 240 according to a first angle (θ1). In particular, the first color (P1) can be attributed to the observer not being able to see the anodized layer 224 overlaying the first and second valleys 214—1, 2 as they can be obscured by the metal oxide layer 242. Additionally, the observer can perceive a second color (P2) different than the first color (P1) when viewing the external surface 202 of the oxidized part 240 according to a second angle (θ2) different than the first angle (θ1). In particular, the second color (P2) can be attributed to the observer not being able to see the first valley 214—1 as the anodized layer 224 overlaying the first valley 214—1 can be obscured by the metal oxide layer 242. Additionally, the observer can perceive a third color (P3) different than the first and second colors (P1, P2) when viewing the external surface 202 of the oxidized part 240 according to a third angle (θ3) different than the first and second angles (θ1, θ2). In particular, the third color (P3) can be attributed to the observer being able to see the respective anodized layer 224 overlaying the first, second, and third valleys 214—1, 2, 3.

In some examples, the first, second, and third colors (P1, P2, P3) can be characterized as having an a* value between −10 to 15 and a b* value between −35 to 30. Although the processed anodized part 230 is not described herein, it should also be noted that an observer can also perceive different colors of the processed anodized part 230 according to the particular viewing angle. In contrast to the oxidized part 240, the processed anodized part 230 can include a combination of the interference color of the anodized layer 224 and of the exposed peaks 212 and/or valleys 214. In particular, the exposed peaks 212 and/or valleys 214 have a natural titanium color.

Figures 10A, 10B:
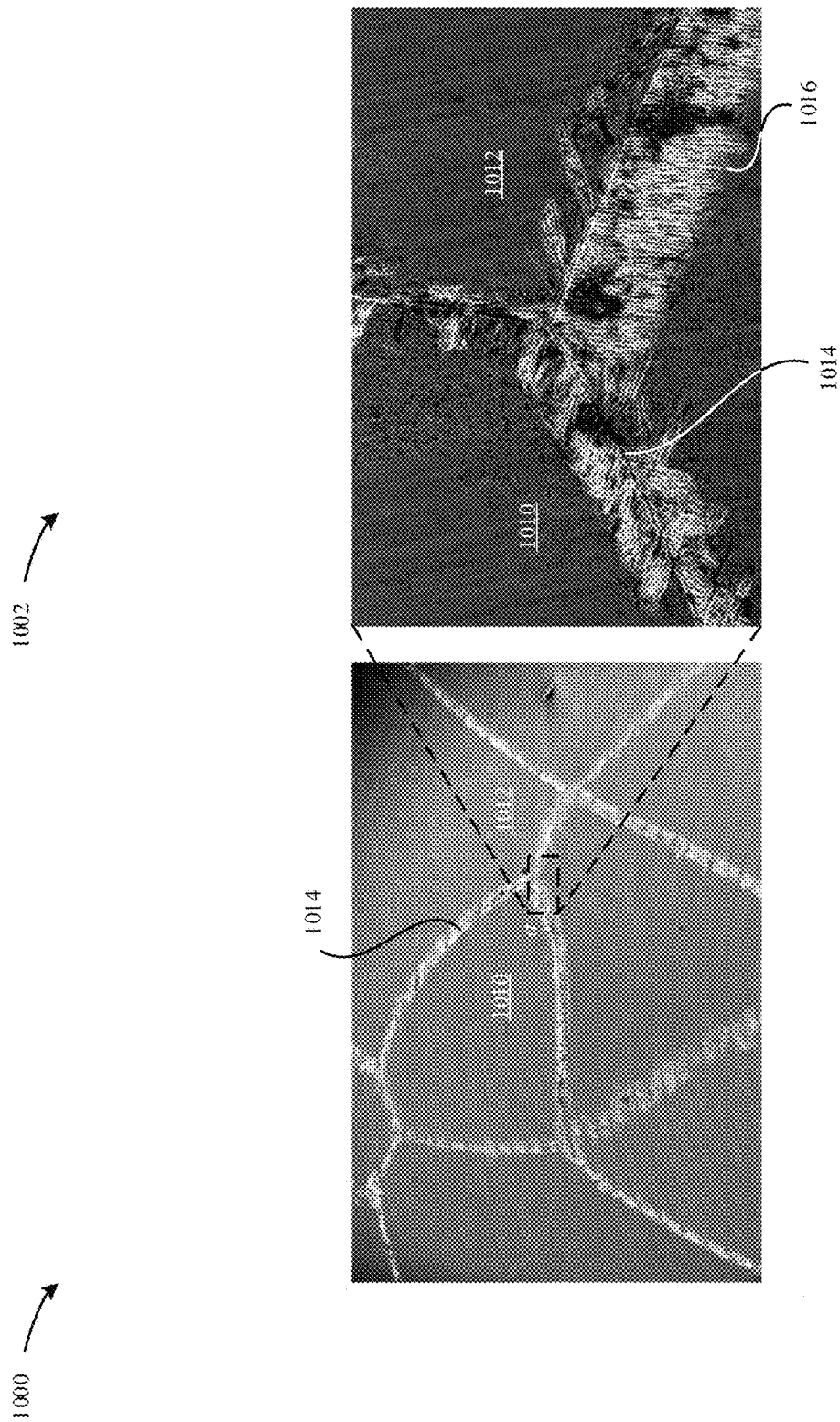
FIGS. 10A-10B illustrate exemplary electron microscope images of a top view of a metal part having grain structures, in accordance with some embodiments.

FIGS. 10A-10B illustrate exemplary electron microscope images of top views of a metal part having grain structures, in accordance with some embodiments. In particular, FIGS. 10A-10B illustrate a treated metal part 1000 and a textured part 1002, respectively. FIG. 10A illustrates a treated metal part 1000 that involves exposing a metal substrate—e.g., the metal substrate 404—to a treatment process such as exposing the metal substrate 404 to a specific heat temperature in order to control the size of grain structures 1010, 1012. In some examples, the heat treatment involves exposure to a temperature between 700° C. to 1050° C. for a duration of 1 to 2 hours. The grain structures 1010, 1012 can be separated by a grain boundary 1014. The treatment process can include precipitating a secondary phase (e.g., alpha phase) at the grain boundary 1014. As a result, the grain structures 1010, 1012 are associated with dual phases (alpha, beta). As a result of the alpha precipitation, grooves 1016 (also referred to as valleys) form on and/or along the periphery of the grain boundary 1014. The grooves 1016 can refer to a shallow dimple or gap that forms along an external surface of the treated metal part 1000, as shown in region (a).

FIG. 10B illustrates the region (a) of the textured part 1002. The textured part 1002 is formed by exposing the treated metal part 1000 to an etching process. The etching process causes selective etching of the external surface of the treated metal part 1000 in accordance with the alpha and beta phases of the grain structures 1010, 1012. In particular, the chemical etching process (e.g., Kroll's etch) selectively etches the alpha phase relative to the beta phase so as to form grooves 1016 (or valleys) in regions of the external surface corresponding to the grain boundary 1014. The grooves 1016 can have a depth of 2 micrometers to 3 micrometers and a width of several tens of micrometers.

Figures 11A, 11B:
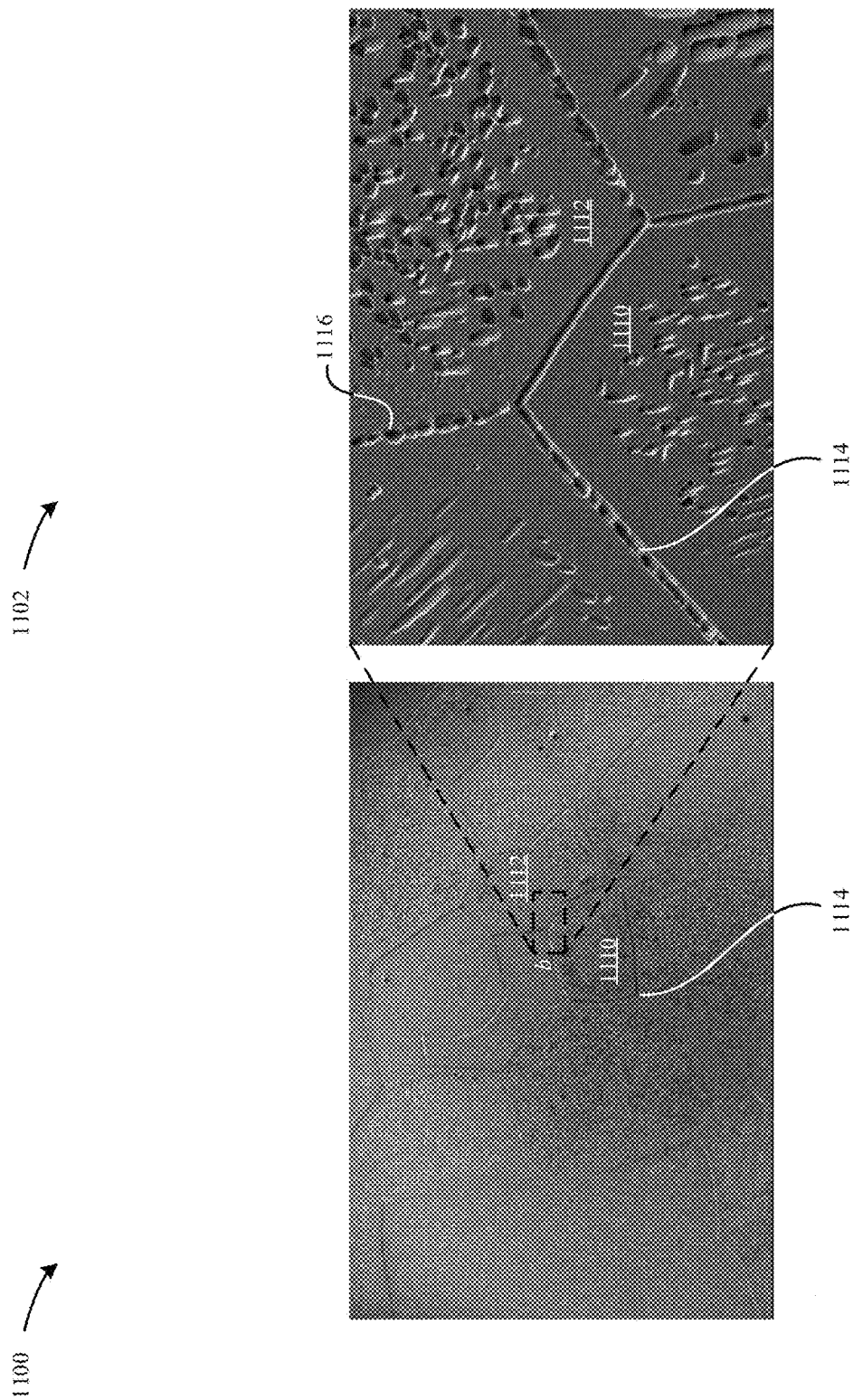
FIGS. 11A-11B illustrate exemplary electron microscope images of a top view of a metal part having grain structures, in accordance with some embodiments.

FIGS. 11A-11B illustrate exemplary electron microscope images of top views of a metal part having grain structures, in accordance with some embodiments. In particular, FIGS. 11A-11B illustrate a metal part 1100 and a textured part 1102, respectively. FIG. 11A illustrates a metal part 1100 having grain structures 1110, 1112. The grain structures 1110 and 1112 are separated by a grain boundary 1114, as depicted in region (b).

FIG. 11B illustrates the region (b) of the textured part 1102. The textured part 1002 is formed by exposing the metal part 1100 to a selective etching process. The selective etching process causes selective etching of the external surface of the metal part 1100. In particular, the chemical etching process (e.g., Kroll's etch) selectively etches the alpha phase relative to the beta phase so as to form grooves 1116 (or valleys) in regions of the external surface corresponding to the grain boundary 1114. The grooves 1116 can have a depth of 7 micrometers to 8 micrometers and a width between 5 to 10 micrometers. In contrast to the grooves 1016 of FIG. 10B, the grooves 1116 are deeper.

FIGS. 12A-12C illustrate exemplary optical microscope images of top views of a metal part having grain structures, in accordance with some embodiments. FIG. 12A illustrates a top view of a textured part 1200—e.g., the textured part 210—according to some embodiments. The textured part 1200 includes grain structures 1210 and 1212 separated by a grain boundary 1214. The grain structures 1210 and 1212 can be associated with alpha and beta phases, respectively.

FIG. 12B illustrates a top view of an anodized part 1202—e.g., the anodized part 220—according to some embodiments. The anodized part 1202 includes an anodized layer 1216 that overlays the grain structures 1210, 1212. In some examples, the anodized part 1202 is formed by exposing the textured part 1200 to different anodizing voltages such as between 1 volt to 70 volts. The thickness of the anodized layer 1216 can be directly proportional to the amplitude of the anodizing voltage. Additionally, the interference color of the anodized layer 1216 can be related to the thickness.

FIG. 12C illustrates a top view of a processed anodized part 1204—e.g., the processed anodized part 230—according to some embodiments. The processed anodized part 230 is formed by exposing the anodized part 1202 to a mechanical finishing process such as a blasting process. The blasting process can reduce the portion of the anodized layer 1216 overlaying the peaks while maintain a greater amount of the anodized layer 1216 overlaying the grooves (or valleys).

Figure 13A:
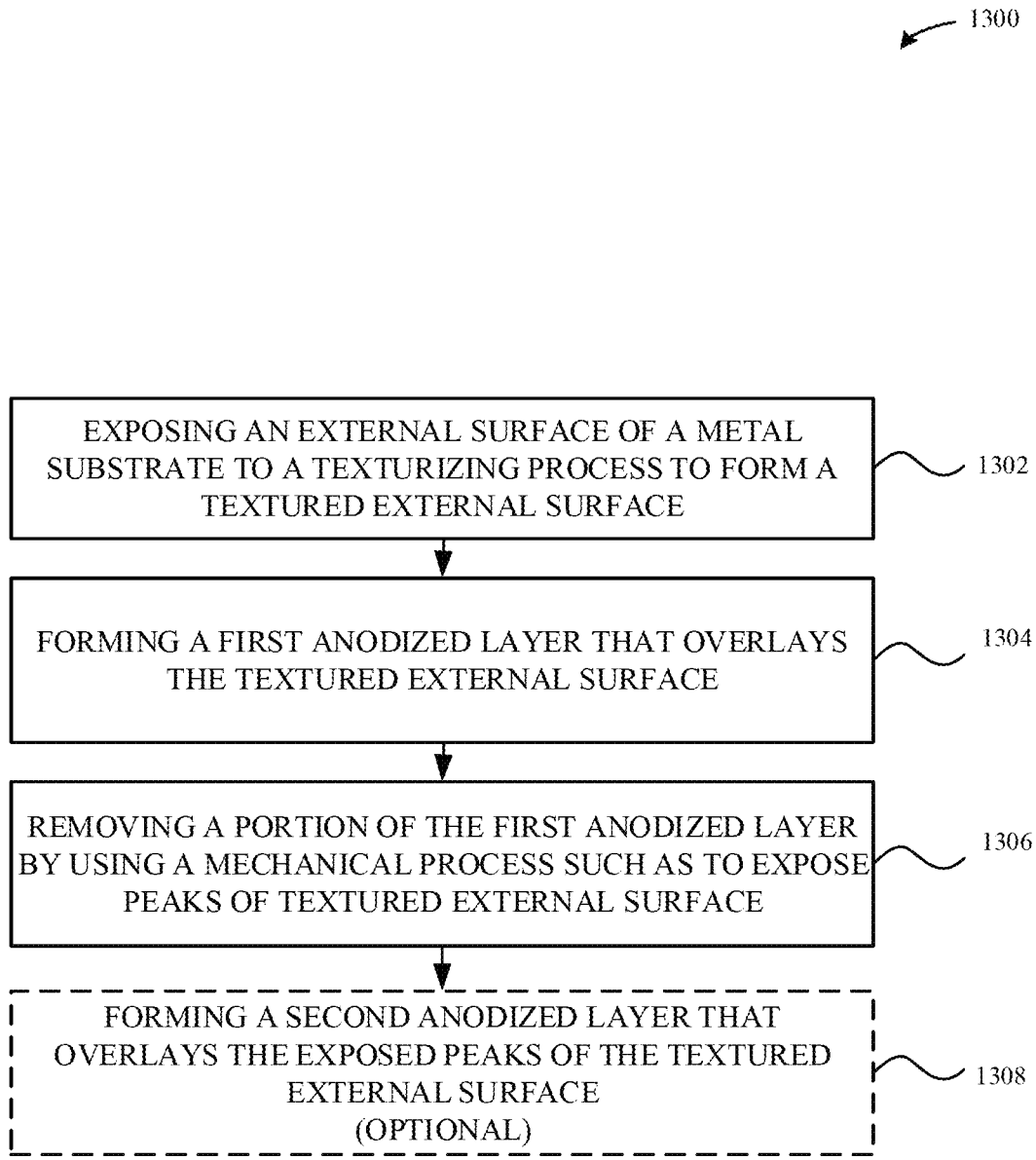
FIG. 13A-13C illustrate flowcharts of different methods for forming a metal part having an anodized coating, in accordance with some embodiments.
Figure 13B:
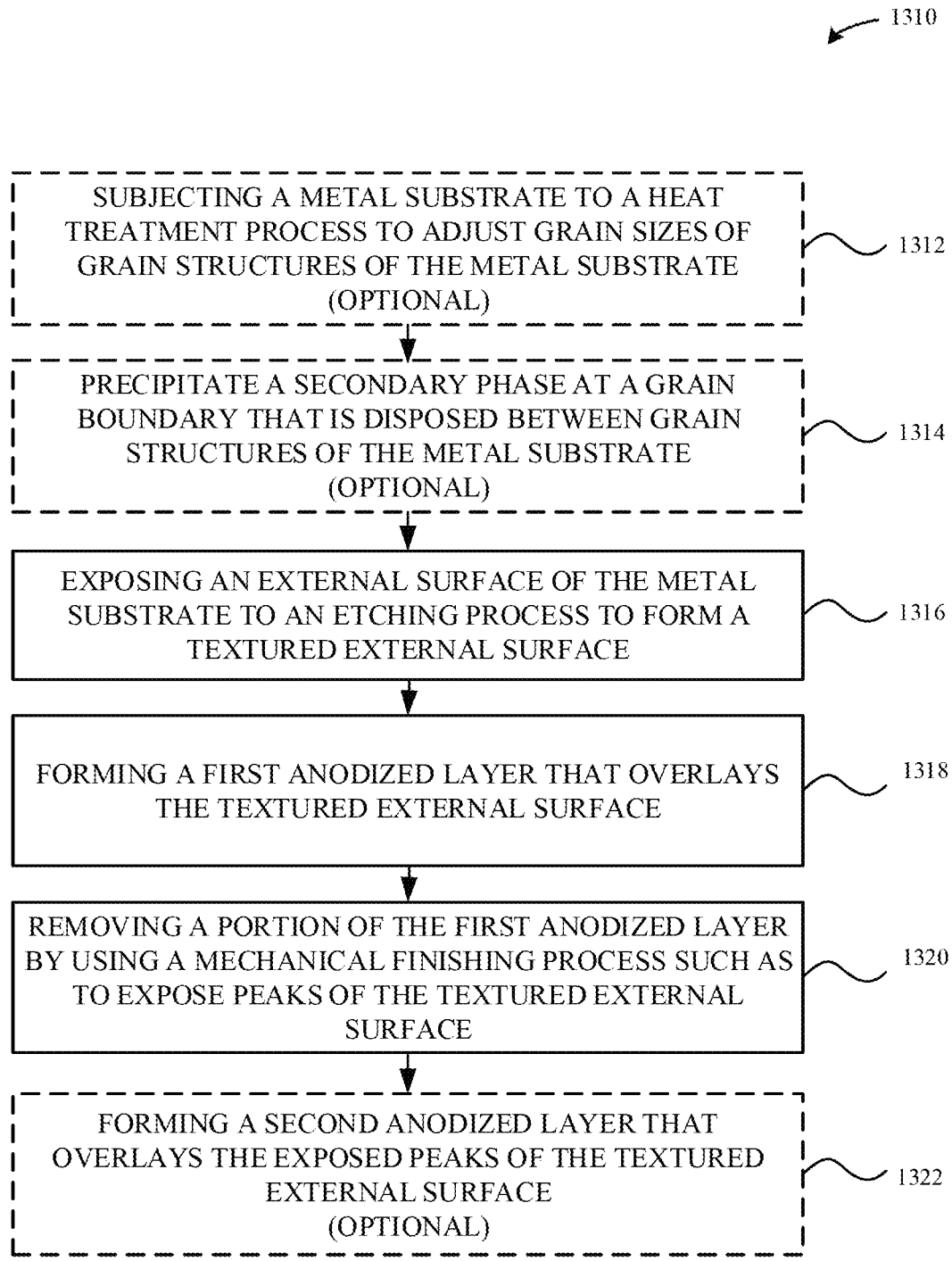
Figure 13C:
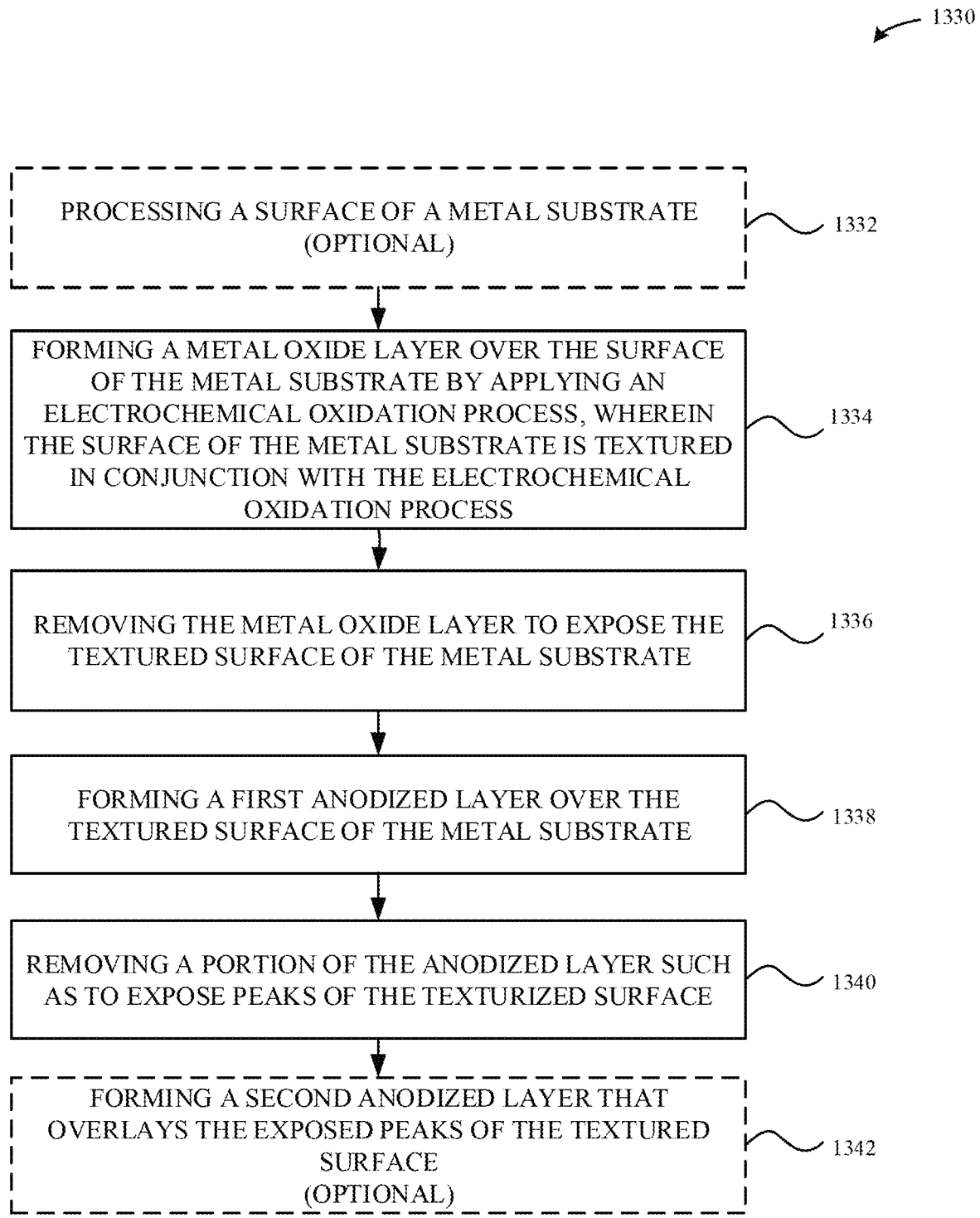

FIG. 13A-13C illustrate flowcharts of different methods for forming a metal part having an anodized coating, in accordance with some embodiments.

FIG. 13A illustrates a method 1300 for forming a metal part having an anodized layer, according to some embodiments. As illustrated in FIG. 13A, the method 1300 begins at step 1302 by exposing an external surface 202 of a metal substrate 204 to a texturizing process to form a textured external surface. The texturizing process can include a mechanical brushing process such as using brushing media. As a result of the texturizing process, the external surface 202 can be modified from a planar external surface to form peaks 212 and valleys 214. The peaks 212 and 214 can be randomly distributed.

At step 1304, a first anodized layer—e.g., the anodized layer 224—is formed to overlay the textured external surface. In some examples, an optical detection system can be utilized to determine whether the first anodized layer has a color that corresponds to a desired interference color.

At step 1306, a portion of the first anodized layer is removed by using a mechanical finishing process (e.g., blasting, etc.) such as to expose peaks 212 of the textured external surface. In some embodiments, more of the peaks 212 of the textured external surface can be exposed than the valleys 214. The optical detection system can be used to determine whether the color of the processed anodized part matches a desired color, then the mechanical finishing process can either continue until the desired color is achieved or end. Notably, the color of the processed anodized part can reflect a combination of the anodized layer and the color of the exposed peaks and/or valleys (e.g., natural titanium color). At step 1308, a second anodized layer—e.g. the metal oxide layer 242—can be optionally formed to overlay the exposed peaks and/or valleys of the textured external surface.

FIG. 13B illustrates a method 1310 for forming a metal part having an anodized layer, according to some embodiments. As illustrated in FIG. 13B, the method 1310 begins at step 1312 by optionally subjecting a titanium alloy—e.g., the metal substrate 404—to a heat treatment process to adjust grain sizes of grain structures 410, 412 of the metal substrate 404. Notably, adjusting the grain sizes provides a level of control for adjusting the amount of fraction of the external surface and the aspect ratio of the grooves (or valleys) formed in the external surface during the etching process. For example, it can be possible to form a series of peaks and valleys separated by a generally uniform or uniform distance apart by controlling the amount of fraction and/or the sizes of the grooves.

At step 1314, the method 1310 involves optionally precipitating a secondary phase at a grain boundary 414 disposed between the grain structures 412, 412 of the metal substrate 404. The metal substrate 404 is exposed to an intermediate heat treatment process to precipitate an alpha phase at the one or more grain boundaries 414 of the metal substrate 404.

At step 1316, the method 1310 involves exposing an external surface 402 of the metal substrate 404 to an etching process to form a textured part 600 having a textured external surface. In some examples, it should be noted that titanium alloys and/or titanium are very hard substances that can be difficult to process using conventional mechanical processes. Accordingly, adjusting the grain sizes of the grain structures 410, 412 prior to the chemical etching process can facilitate in forming a tunable amount of fractions of peaks 612 and valleys 614 along the external surface 402. A detection system such as Electron Backscatter Diffraction (EBSD) can be used to scan the surface of the textured part 600 to detect grain boundaries and grain orientations.

At step 1318, a first anodized layer—e.g., the anodized layer 702—can be formed such as to overlay the peaks 612 and valleys 614 of the textured external surface. In some examples, an optical detection system can be utilized to determine whether the anodized layer has a color that corresponds to a desired color.

At step 1320, a portion of the first anodized layer is removed by using a mechanical finishing process (e.g., blasting, polishing, etc.) such as to expose at least some of the peaks 612 of the textured external surface such as to form a processed anodized part 700. The optical detection system can be used to determine whether the color of the processed anodized part 700 matches a desired color, then the mechanical finishing process can either continue or end. Notably, the color of the processed anodized part 700 can reflect a combination of the anodized layer and the color of the exposed peaks and/or valleys (e.g., natural titanium color).

At step 1322 involves optionally forming a second anodized layer—e.g., the metal oxide layer 242—that overlays the exposed peaks of the textured external surface as part of forming an oxidized part 800. Notably, the color of the oxidized part 800 can reflect a combination of the anodized layer and the metal oxide layer.

FIG. 13C illustrates a method 1330 for forming a metal part having an anodized coating, according to some embodiments. As illustrated in FIG. 13C, the method 1330 begins at step 1332 where a metal substrate—e.g., the metal substrate (e.g., titanium or alloy thereof, etc.)—is subject to a processing step. In some examples, the processing step includes blasting the external surface of the metal substrate to form a matte surface finish and/or polishing the external surface to form a high—gloss surface finish.

At step 1334, a metal oxide layer is formed over the external surface of the metal substrate by applying an electrochemical oxidation process (e.g., micro arc oxidation, etc.). Techniques for using micro-arc oxidation to texturize an external surface of a titanium or titanium alloy substrate are described with reference to U.S. application Ser. No. 16/584,692 entitled "TITANIUM PARTS HAVING A BLASTED SURFACE TEXTURE," filed Sep. 26, 2019, the contents of which are incorporated herein by their entirety for all purposes. In conjunction with performing the electrochemical oxidation process, the external surface of the metal substrate is roughened to form a texturized surface having alternating peaks and valleys. According to some examples, the electrochemical oxidation process includes applying a high-voltage anodizing process to the metal oxide layer that causes plasma discharge events. The plasma discharge events cause portions of the metal oxide layer to melt, thereby resulting in a crystalline structure. The metal oxide layer can have a Vickers Hardness value of about 2000 HV.

Subsequently, at step 1336, the metal oxide layer is removed and separated from the surface of the metal substrate. In particular, the metal oxide layer is exposed to a chemical stripping solution (e.g., phosphoric acid, etc.) during a self-limiting removal process that is dependent upon the metal of the metal substrate being resistant to chemical etching. The chemical stripping solution completely erodes away the metal oxide layer but does not affect (i.e., erode) the alternating peaks and valleys of the metal substrate. By removing the metal oxide layer, the alternating peaks and valleys of the metal substrate are exposed.

Thereafter, at step 1338, an anodized layer can be formed over the alternating peaks and valleys. The anodized layer can impart the metal substrate with a thin-film interference color. In some examples, an optical detection system can be utilized to determine whether the anodized layer has a color that corresponds to a desired color. As a result of determining whether the color of the anodized layer matches to the desired color, then the anodization process can either continue or end.

At step 1340, a portion of the anodized layer can be removed such as to expose peaks and/or valleys. The peaks and valleys can be flattened with the peaks being disproportionately reduced relative to the valleys. The flattening process can involve using a blasting or polishing process. In some examples, an optical detection system can be utilized to determine whether the color of the processed part corresponds to a desired color. As a result of determining whether the color matches to the desired color, then the flattening process can either continue or end.

At step 1342, a second anodized layer can be formed to overlay the exposed peaks and/or valleys.

Figure 14:
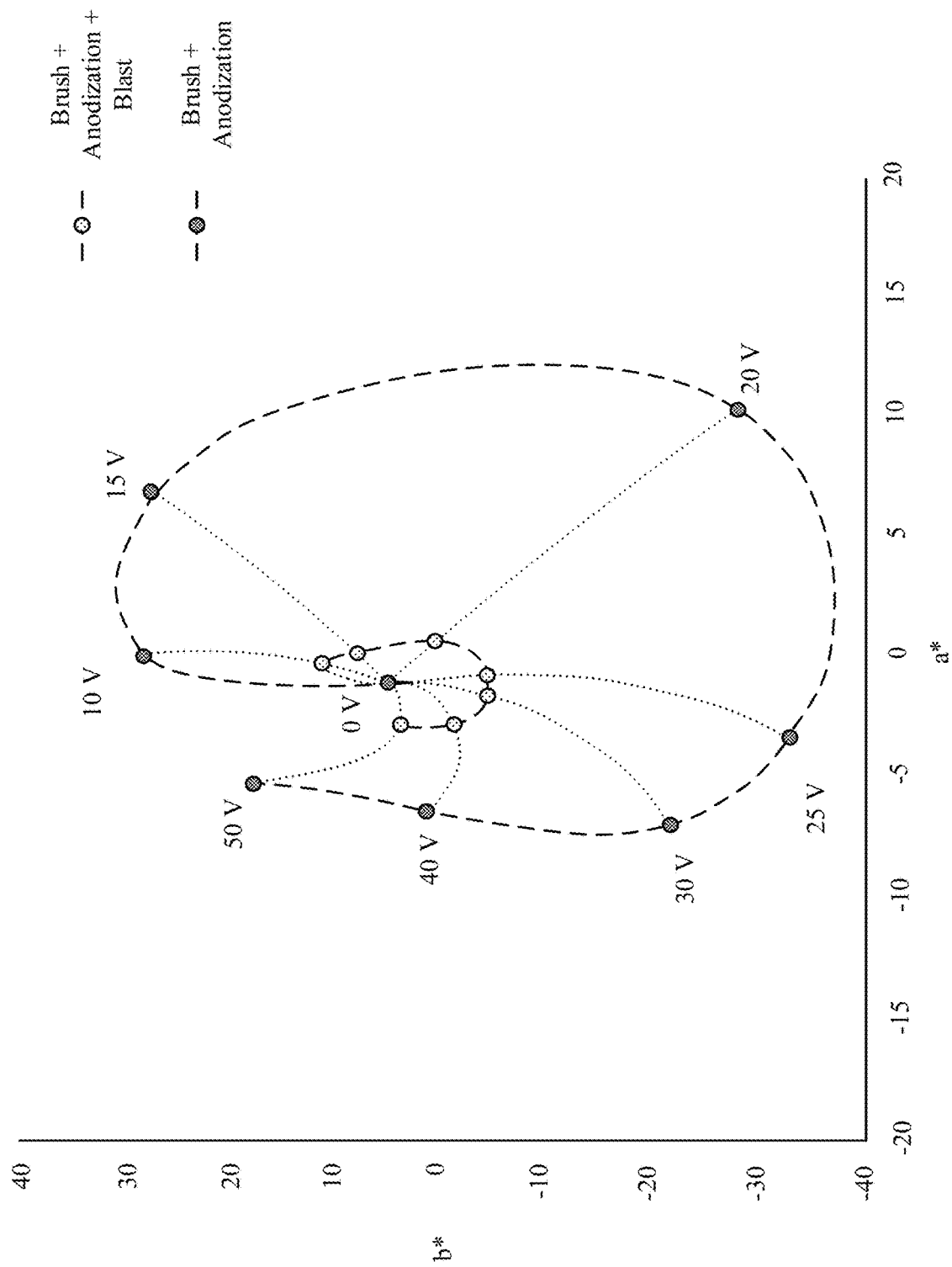
FIG. 14 illustrates an exemplary diagram of potential a* and b* values of metal parts having an anodized coating, in accordance with some embodiments.

FIG. 14 illustrates an exemplary diagram of potential a* and b* values of metal parts having an anodized coating, in accordance with some embodiments. In some embodiments, the metal parts can correspond to the anodized metal part 220 and the processed anodized part 230.

As described herein, the anodized metal part 220 can be formed by exposing an external surface 202 of a metal substrate 204 to a brushing process such as to form peaks 212 and valleys 214 along the external surface 202. Thereafter, an anodized layer 224 is formed to overlay the external surface 202. The anodized metal part 220 can have a color, using a CIE L*a*b* color space model, the surface coating has a color having an a* value between −10 to 15 and a b* value between −35 to 30. The range of color of the anodized metal part 220 is depicted as ("Brushed+Anodized") in FIG. 14. In particular, the color of the anodized metal part 220 is solely dependent upon the thickness of the anodized layer 224 because the anodized layer 224 overlays the entire external surface 202 of the anodized metal part 220. As understood by those of ordinary skill in the art, the thickness of the anodized layer 224 is proportional to the anodizing voltage. FIG. 14 illustrates that different anodizing voltages between 5 volts to 65 volts can adjust the thickness (and therefore color) of the anodized layer 224. However, the color of the anodized metal part 220 is limited to only colors along the lines of the color wheel depicted as ("Brushed+Anodized") shown in FIG. 14.

In contrast, the processed anodized part 230 exhibits color variability and tunability not possible with the anodized metal part 220. As described herein, the processed anodized part 230 can be formed by exposing the anodized metal part 220 to a mechanical finishing process (e.g., blasting, lapping, polishing, etc.). By blasting the external surface 202 of the anodized metal part 220, different amounts of material from the peaks 212 and/or valleys 214 can be selectively removed so as to achieve more variability in color. In particular, the color of the anodized metal part 220 can be based upon the color of the exposed peaks and/or valleys as well as the color of the anodized layer 224. In some examples, the color of the exposed peaks and/or valleys resembles natural titanium, which as depicted in FIG. 14 has an a* value of about 0 and a b* value of about 0. FIG. 14 illustrates the processed anodized part 230 having a color wheel ("Brushed+Anodized+Blast")

For example, FIG. 14 illustrates that forming the anodized layer 224 with an anodizing voltage of 25 volts previously limited the anodized metal part 220 to a b* value of about −35 and an a* value of about −5. However, the mechanical finishing process can selectively remove a gradient amount of the anodized layer 224, thereby gradually shifting the color along a spoke between the color wheel ("Brushed+Anodized") and the color wheel depicted as ("Brushed+Anodized+Blast"). FIG. 14 illustrates that the processed anodized part 230 having an anodized layer 224 formed using an anodizing voltage of 25 volts can have a color with an a* value anywhere between −3 to 0 and a b* value anywhere between −35 to 5.

In another example, forming the anodized layer 224 with an anodizing voltage of 15 volts previously limited the anodized metal part 220 to a b* value of about 30 and an a* value of about 8 as shown by the color wheel ("Brushed+Anodized"). However, the mechanical finishing process can selectively remove a gradient amount of the anodized layer 224, thereby gradually shifting the color along a spoke between the color wheel ("Brushed+Anodized") and the color wheel depicted as ("Brushed+Anodized+Blast"). FIG. 14 illustrates that the processed anodized part 230 having an anodized layer 224 formed using an anodizing voltage of 15 volts can have a color with an a* value anywhere between 0 to 8 and a b* value anywhere between −5 to 30.

Accordingly, FIG. 14 illustrates that the processed anodized part 230 can have a color having an a* value anywhere between −10 to 15 and a b* value anywhere between −35 to 30. In other words, the color of the processed anodized part 230 is anywhere between the color wheel ("Brushed+Anodized") and the color wheel depicted as ("Brushed+Anodized+Blast").

Any ranges cited herein are inclusive. The terms "substantially", "generally," and "about" used herein are used to describe and account for small fluctuations. For example, they can refer to less than or equal to ±5%, such as less than or equal to ±2%, such as less than or equal to ±1%, such as less than or equal to ±0.5%, such as less than or equal to ±0.1%.

The various aspects, embodiments, implementations or features of the described embodiments can be used separately or in any combination. Various aspects of the described embodiments can be implemented by software, hardware or a combination of hardware and software. The described embodiments can also be embodied as computer readable code on a computer readable medium for controlling manufacturing operations or as computer readable code on a computer readable medium for controlling a manufacturing line. The computer readable medium is any data storage device that can store data which can thereafter be read by a computer system. Examples of the computer readable medium include read-only memory, random-access memory, CD-ROMs, HDDs, DVDs, magnetic tape, and optical data storage devices. The computer readable medium can also be distributed over network-coupled computer systems so that the computer readable code is stored and executed in a distributed fashion.

To the extent applicable to the present technology, gathering and use of data available from various sources can be used to improve the delivery to users of invitational content or any other content that can be of interest to them. The present disclosure contemplates that in some instances, this gathered data can include personal information data that uniquely identifies or can be used to contact or locate a specific person. Such personal information data can include demographic data, location-based data, telephone numbers, email addresses, TWITTER® ID's, home addresses, data or records relating to a user's health or level of fitness (e.g., vital signs measurements, medication information, exercise information), date of birth, or any other identifying or personal information.

The present disclosure recognizes that the use of such personal information data, in the present technology, can be used to the benefit of users. For example, the personal information data can be used to deliver targeted content that is of greater interest to the user. Accordingly, use of such personal information data enables users to calculated control of the delivered content. Further, other uses for personal information data that benefit the user are also contemplated by the present disclosure. For instance, health and fitness data can be used to provide insights into a user's general wellness, or can be used as positive feedback to individuals using technology to pursue wellness goals.

The present disclosure contemplates that the entities responsible for the collection, analysis, disclosure, transfer, storage, or other use of such personal information data will comply with well-established privacy policies and/or privacy practices. In particular, such entities should implement and consistently use privacy policies and practices that are generally recognized as meeting or exceeding industry or governmental requirements for maintaining personal information data private and secure. Such policies should be easily accessible by users, and should be updated as the collection and/or use of data changes. Personal information from users should be collected for legitimate and reasonable uses of the entity and not shared or sold outside of those legitimate uses. Further, such collection/sharing should occur after receiving the informed consent of the users. Additionally, such entities should consider taking any needed steps for safeguarding and securing access to such personal information data and ensuring that others with access to the personal information data adhere to their privacy policies and procedures. Further, such entities can subject themselves to evaluation by third parties to certify their adherence to widely accepted privacy policies and practices. In addition, policies and practices should be adapted for the particular types of personal information data being collected and/or accessed and adapted to applicable laws and standards, including jurisdiction-specific considerations. For instance, in the US, collection of or access to certain health data can be governed by federal and/or state laws, such as the Health Insurance Portability and Accountability Act (HIPAA); whereas health data in other countries can be subject to other regulations and policies and should be handled accordingly. Hence different privacy practices should be maintained for different personal data types in each country.

Despite the foregoing, the present disclosure also contemplates examples in which users selectively block the use of, or access to, personal information data. That is, the present disclosure contemplates that hardware and/or software elements can be provided to prevent or block access to such personal information data. For example, in the case of advertisement delivery services, the present technology can be configured to allow users to select to "opt in" or "opt out" of participation in the collection of personal information data during registration for services or anytime thereafter. In another example, users can select not to provide mood-associated data for targeted content delivery services. In yet another example, users can select to limit the length of time mood-associated data is maintained or entirely prohibit the development of a baseline mood profile. In addition to providing "opt in" and "opt out" options, the present disclosure contemplates providing notifications relating to the access or use of personal information. For instance, a user may be notified upon downloading an app that their personal information data will be accessed and then reminded again just before personal information data is accessed by the app.

Moreover, it is the intent of the present disclosure that personal information data should be managed and handled in a way to minimize risks of unintentional or unauthorized access or use. Risk can be minimized by limiting the collection of data and deleting data once it is no longer needed. In addition, and when applicable, including in certain health related applications, data de-identification can be used to protect a user's privacy. De-identification may be facilitated, when appropriate, by removing specific identifiers (e.g., date of birth, etc.), controlling the amount or specificity of data stored (e.g., collecting location data a city level rather than at an address level), controlling how data is stored (e.g., aggregating data across users), and/or other methods.

Therefore, although the present disclosure broadly covers use of personal information data to implement one or more various disclosed examples, the present disclosure also contemplates that the various examples can also be implemented without the need for accessing such personal information data. That is, the various examples of the present technology are not rendered inoperable due to the lack of all or a portion of such personal information data. For example, content can be selected and delivered to users by inferring preferences based on non-personal information data or a bare minimum amount of personal information, such as the content being requested by the device associated with a user, other non-personal information available to the content delivery services, or publicly available information.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of specific embodiments are presented for purposes of illustration and description. They are not intended to be exhaustive or to limit the described embodiments to the precise forms disclosed. It will be apparent to one of ordinary skill in the art that many modifications and variations are possible in view of the above teachings.

What is claimed is:

1. An enclosure for a portable electronic device, the enclosure comprising:
   a titanium substrate defining a textured surface and a nominal surface, the titanium substrate comprising:
      a first region that extends above the nominal surface;
      a second region adjacent to the first region and extending below the nominal surface, a separation distance between an apex of the first region and a bottom of a trough defined by the second region being at least 1 micrometer; and
      a metal oxide layer overlaying the trough defined by the second region;

wherein the titanium substrate further comprises a first grain structure and a second grain structure, the second region corresponding to a grain boundary that separates the first grain structure from the second grain structure.

2. The enclosure of claim 1, wherein the enclosure has a color having an a* value between −10 to 15 and a b* value between −35 to 30 in a CIE L*a*b* color space.

3. The enclosure of claim 2, wherein the color is dependent upon a thickness of the metal oxide layer.

4. The enclosure of claim 3, wherein the metal oxide layer has a thickness between 20 nanometers and 200 nanometers.

5. The enclosure of claim 1, wherein the metal oxide layer comprises an anodized layer formed from the titanium substrate.

6. The enclosure of claim 1, wherein the metal oxide layer comprises a first metal oxide layer having a first thickness that overlays the apex of the first region and a second metal oxide layer overlaying the trough defined by the second region, the second metal oxide layer having a second thickness different than the first thickness.

7. The enclosure of claim 1, wherein the first grain structure is oriented in a first orientation and the second grain structure is oriented in a second orientation different from the first orientation.

* * * * *